(12) United States Patent
Kim et al.

(10) Patent No.: US 10,185,798 B2
(45) Date of Patent: Jan. 22, 2019

(54) LAYOUT DESIGN SYSTEM, SEMICONDUCTOR DEVICE USING THE LAYOUT DESIGN SYSTEM, AND FABRICATING METHOD THEREOF

(71) Applicant: Samsung Electronics Co., Ltd., Suwon-si (KR)

(72) Inventors: Hyo Jin Kim, Bucheon-si (KR); Su Hyeon Kim, Bucheon-si (KR); Azmat Raheel, Suwon-si (KR); Chul Hong Park, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 18 days.

(21) Appl. No.: 15/343,860

(22) Filed: Nov. 4, 2016

(65) Prior Publication Data
US 2017/0255735 A1    Sep. 7, 2017

(30) Foreign Application Priority Data
Mar. 2, 2016    (KR) .................. 10-2016-0025040

(51) Int. Cl.
*G06F 17/50* (2006.01)
*H01L 29/423* (2006.01)
(Continued)

(52) U.S. Cl.
CPC .. *G06F 17/5072* (2013.01); *H01L 21/823821* (2013.01); *H01L 21/823871* (2013.01);
(Continued)

(58) Field of Classification Search
None
See application file for complete search history.

(56) References Cited

U.S. PATENT DOCUMENTS

| 6,605,847 B2 | 8/2003 | Kim et al. |
| 7,002,207 B2 | 2/2006 | Kim et al. |

(Continued)

*Primary Examiner* — Angel Roman
(74) *Attorney, Agent, or Firm* — Muir Patent Law, PLLC

(57) ABSTRACT

A layout design system, semiconductor device using the layout design system, and fabricating method thereof are provided. The fabricating method of a semiconductor device includes loading a first layout, wherein the first layout comprises a first active region and a first dummy region, and the first active region comprises a fin-type pattern design having a first width, generating a second layout by substituting the fin-type pattern design with a nanowire structure design and forming a nanowire structure by using the second layout, wherein the second layout comprises a second active region in the same size as the first active region, and a second dummy region in the same size as the first dummy region, the nanowire structure design has a second width greater than the first width, and the nanowire structure comprises a first nanowire extending in a first direction, a second nanowire extending in the first direction and being formed on the first nanowire at a spacing apart from the first nanowire, a gate electrode surrounding a periphery of the first nanowire and extending in a second direction of intersecting with the first direction, a gate spacer being formed on a sidewall of the gate electrode and comprising an inner sidewall and an outer sidewall facing each other, the inner sidewall of the gate spacer facing a side surface of the gate electrode, and a source/drain epitaxial layer on at least one side of the gate electrode and being connected to the first nanowire.

20 Claims, 29 Drawing Sheets

(51) Int. Cl.
*H01L 27/02* (2006.01)
*H01L 27/092* (2006.01)
*H01L 21/8238* (2006.01)
*H01L 29/06* (2006.01)

(52) U.S. Cl.
CPC ...... *H01L 27/0207* (2013.01); *H01L 27/0924* (2013.01); *H01L 29/0673* (2013.01); *H01L 29/42392* (2013.01); *H01L 21/823807* (2013.01); *H01L 21/823814* (2013.01); *H01L 21/823864* (2013.01)

(56) References Cited

U.S. PATENT DOCUMENTS

| | | |
|---|---|---|
| 7,381,601 B2 | 6/2008 | Kim et al. |
| 7,696,046 B2 | 4/2010 | Kim et al. |
| 7,768,070 B2 | 8/2010 | Yun et al. |
| 7,820,513 B2 | 10/2010 | Hareland et al. |
| 7,893,492 B2 | 2/2011 | Bedell et al. |
| 8,110,471 B2 | 2/2012 | Lee et al. |
| 8,536,029 B1 | 9/2013 | Chang et al. |
| 8,541,774 B2 | 9/2013 | Bangsaruntip et al. |
| 8,659,006 B1 | 2/2014 | Chang et al. |
| 8,722,472 B2 | 5/2014 | Chang et al. |
| 8,742,511 B2 | 6/2014 | Chang et al. |
| 8,809,957 B2 | 8/2014 | Bangsaruntip et al. |
| 8,969,149 B2 | 3/2015 | Leobandung |
| 8,969,934 B1 | 3/2015 | Cheng et al. |
| 8,987,794 B2 | 3/2015 | Rachmady et al. |
| 8,994,081 B2 | 3/2015 | Leobandung |
| 9,012,284 B2 | 4/2015 | Glass et al. |
| 9,171,845 B2 | 10/2015 | Suk et al. |
| 9,904,753 B2 * | 2/2018 | Kim ............... G06F 17/5072 |
| 2014/0001441 A1 | 1/2014 | Kim et al. |
| 2015/0041899 A1 | 2/2015 | Yang et al. |
| 2015/0147863 A1 | 5/2015 | Sell |
| 2015/0249039 A1 | 9/2015 | Shieh et al. |
| 2015/0311085 A1 | 10/2015 | Kozarsky et al. |
| 2015/0370949 A1 * | 12/2015 | Moroz ............ G06F 17/5072 716/119 |
| 2016/0085903 A1 * | 3/2016 | Han ............... G06F 17/5081 716/103 |
| 2016/0163716 A1 * | 6/2016 | Zhang ............ H01L 27/1104 257/401 |
| 2016/0283634 A1 * | 9/2016 | Kim ............... G06F 17/5072 |
| 2017/0286584 A1 * | 10/2017 | Lefferts ......... G06F 17/5072 |

* cited by examiner

1200

1300

LAYOUT DESIGN SYSTEM, SEMICONDUCTOR DEVICE USING THE LAYOUT DESIGN SYSTEM, AND FABRICATING METHOD THEREOF

CROSS-REFERENCE TO RELATED APPLICATION

This application claims priority from Korean Patent Application No. 10-2016-0025040 filed on Mar. 2, 2016 in the Korean Intellectual Property Office, and all the benefits accruing therefrom under 35 U.S.C. 119, the contents of which in its entirety are herein incorporated by reference.

BACKGROUND

Technical Field

The present disclosure relates to a layout design system, a semiconductor device using the layout design system, and a fabricating method thereof.

Description of the Related Art

One of the scaling technologies for increasing the density of semiconductor devices utilizes multi-gate transistors in which silicon bodies in a fin or nanowire shape are formed on a substrate, with gates then being formed on surfaces of the silicon bodies.

The use of multi-gate transistors allows for easy scaling, as they include a three-dimensional channel. Furthermore, current control capability can be enhanced without requiring increased gate length for the multi-gate transistors. Additionally, it is possible to effectively suppress short channel effect (SCE) which is the phenomenon that the electric potential of the channel region is influenced by the drain voltage.

SUMMARY

It is a technical object of the present disclosure to provide a fabricating method of a semiconductor device with improved operating characteristics.

It is another technical object of the present disclosure to provide a layout design system to fabricate a semiconductor device with improved operating characteristics.

It is yet another technical object of the present disclosure to provide a computer program to fabricate a semiconductor device with improved operating characteristics.

It is yet another technical object of the present disclosure to provide a semiconductor device with improved operating characteristics.

The objects according to the present disclosure are not limited to those set forth above and objects other than those set forth above will be clearly understood to a person skilled in the art from the following description.

According to an aspect of the he below described exemplary implementations of the disclosed subject matter herein, there is provided a fabricating method of a semiconductor device, comprising loading a first layout, wherein the first layout comprises a first active region and a first dummy region, and the first active region comprises a fin-type pattern design having a first width, generating a second layout by substituting the fin-type pattern design with a nanowire structure design and forming a nanowire structure by using the second layout, wherein the second layout comprises a second active region in the same size as the first active region, and a second dummy region in the same size as the first dummy region, the nanowire structure design has a second width greater than the first width, and the nanowire structure comprises a first nanowire extending in a first direction, a second nanowire extending in the first direction and being formed on the first nanowire at a spacing apart from the first nanowire, a gate electrode surrounding a periphery of the first nanowire and extending in a second direction of intersecting with the first direction, a gate spacer being formed on a sidewall of the gate electrode and comprising an inner sidewall and an outer sidewall facing each other, the inner sidewall of the gate spacer facing a side surface of the gate electrode, and a source/drain epitaxial layer on at least one side of the gate electrode and being connected to the first nanowire.

According to another exemplary implementation, there is provided a fabricating method of a semiconductor device, comprising loading a first layout, wherein the first layout comprises first to third fin-type pattern designs extending in parallel, removing the first to third fin-type pattern designs from the first layout, generating a second layout by adding to the first layout first and second nanowire structure designs extending in parallel in the first direction and forming first and second nanowire structures on a substrate by using the second layout, wherein the first nanowire structure comprises at least two nanowires extending in the same direction.

According to still another exemplary implementation, there is provided a fabricating method of a semiconductor device, comprising loading a first layout and detecting a first active region in the first layout, wherein a fin-type pattern design of a first width is spaced apart by a first pitch in the first active region, removing the fin-type pattern design in the first active region, generating a second layout comprising a second active region by substituting the first active region with the second active region wherein a nanowire structure design is spaced apart by a second pitch different from the first pitch, forming a nanowire structure by using the second layout and forming a contact on the nanowire structure by using an upper structure layout, wherein the upper structure layout corresponds to the first layout.

According to yet another exemplary implementation, there is provided a semiconductor device layout design system, comprising a processor, a storage configured to store a first layout comprising a fin-type pattern design of a first width and a dummy fin-type pattern design, and an upper structure layout overlapped with the fin-type pattern design, wherein the fin-type pattern design is spaced apart from each other by a first pitch and a re-design module configured to cause the processor to remove the fin-type pattern design and the dummy fin-type pattern design from the first layout, and add a nanowire structure design and a dummy nanowire structure design of a second width greater than the first width in order to generate a second layout, wherein the nanowire structure design is spaced apart from each other by a second pitch, and a distance as a sum of three times the first width and two times the first pitch is equal to a distance as a sum of two times the second width and the second pitch.

According to another exemplary implementation, there is provided a computer program recorded on a recording medium, which implements, when combined with a computing apparatus, loading a first layout comprising a fin-type pattern design of a first width and a dummy fin-type pattern design, removing the fin-type pattern design and the dummy fin-type pattern design from the first layout, and generating a second layout by adding a nanowire structure design and a dummy nanowire structure design of a second width greater than the first width, wherein the nanowire structure design is spaced apart from each other by a second pitch, and a distance as a sum of three times the first width and two times the first pitch is equal to a distance as a sum of two times the second width and the second pitch.

According to yet another exemplary implementation, there is provided a semiconductor device, comprising a substrate comprising first and second regions, wherein the first region comprises a first active region, and the second region comprises a second active region, first to third fin-type patterns protruding further than the substrate in the first active region and first and second nanowire structures formed on the substrate in the second active region, wherein a distance as a sum of a width of each of the first to third fin-type patterns, a pitch between the first and second fin-type patterns, and a pitch between the second and third fin-type patterns is equal to a distance as a sum of widths of the first and second nanowire structures and a pitch between the first and second nanowire structures.

BRIEF DESCRIPTION OF THE DRAWINGS

The above and other objects, features and advantages of the present disclosure will become more apparent to those of ordinary skill in the art by describing in detail exemplary implementations thereof with reference to the accompanying drawings, in which.

DETAILED DESCRIPTION

Figure 1:
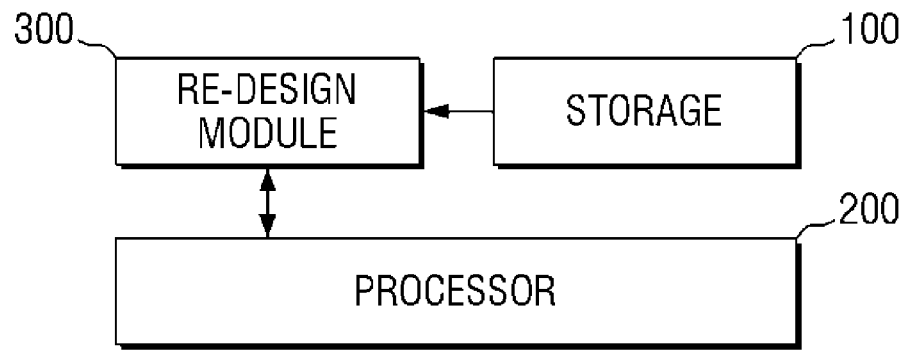
FIG. 1 is a block diagram provided to explain a layout design system according to some exemplary implementations.

The present disclosure now will be described more fully hereinafter with reference to the accompanying drawings, in which various exemplary implementations are shown. The invention may, however, be embodied in many different forms and should not be construed as limited to the example exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary implementations, when taking the figures and their description as a whole into consideration.

Although the figures described herein may be referred to using language such as "one exemplary implementations," or "certain exemplary implementations," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary implementation.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other. The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Exemplary implementations described herein will be described referring to plan views and/or cross-sectional views by way of ideal schematic views. Accordingly, the exemplary views may be modified depending on manufacturing technologies and/or tolerances. Therefore, the disclosed implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinbelow, a layout design system according to some exemplary implementations, a semiconductor device using the layout design system, and a fabricating method thereof will be described.

Figure 2:
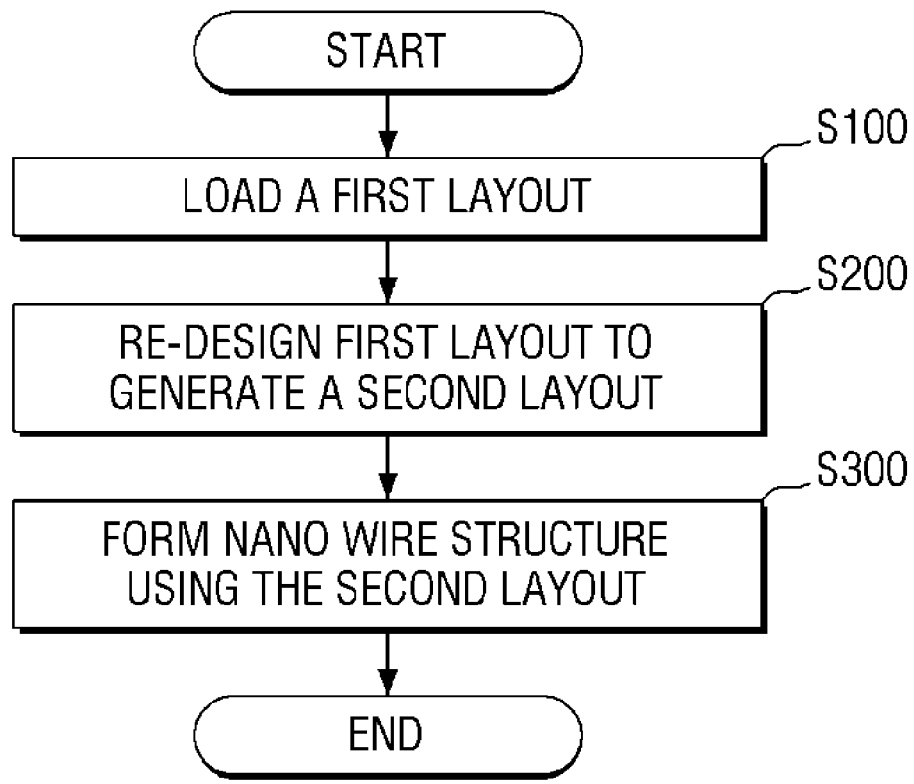
FIG. 2 is a flowchart provided to explain a fabricating method of a semiconductor device according to some exemplary implementations.
Figure 3:
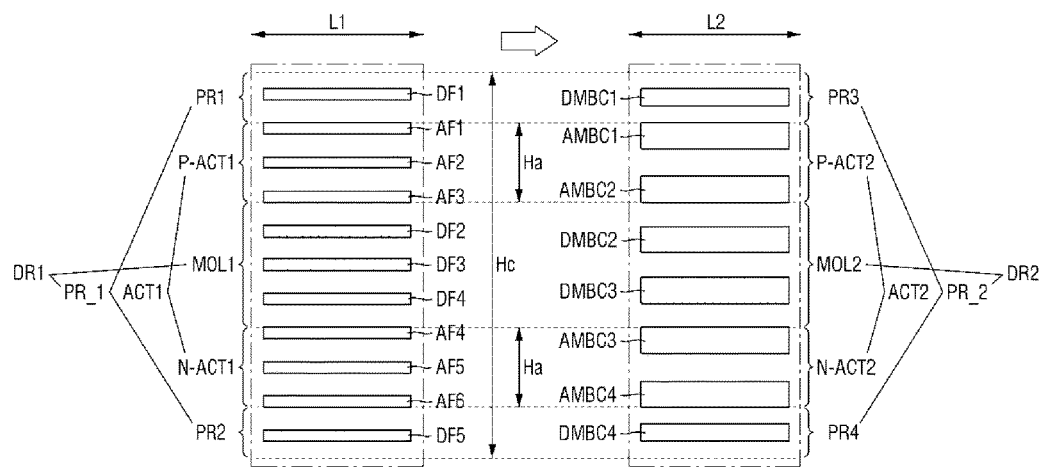
FIG. 3 is an exemplary view provided to compare two layouts to explain operations of the re-design module of FIG. 2.
Figure 4:
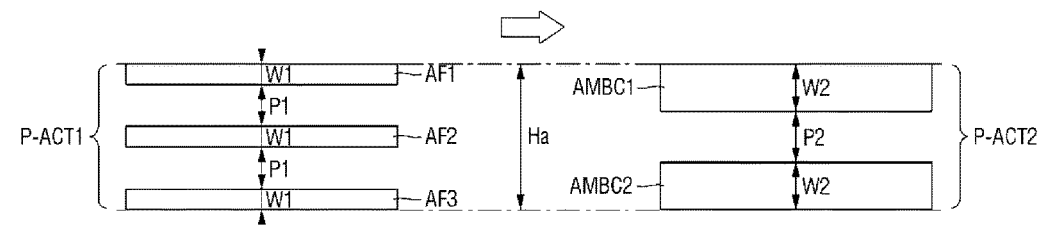
FIG. 4 is an exemplary view provided to compare the first PMOS region and the second PMOS region of FIG. 3.
Figure 5:
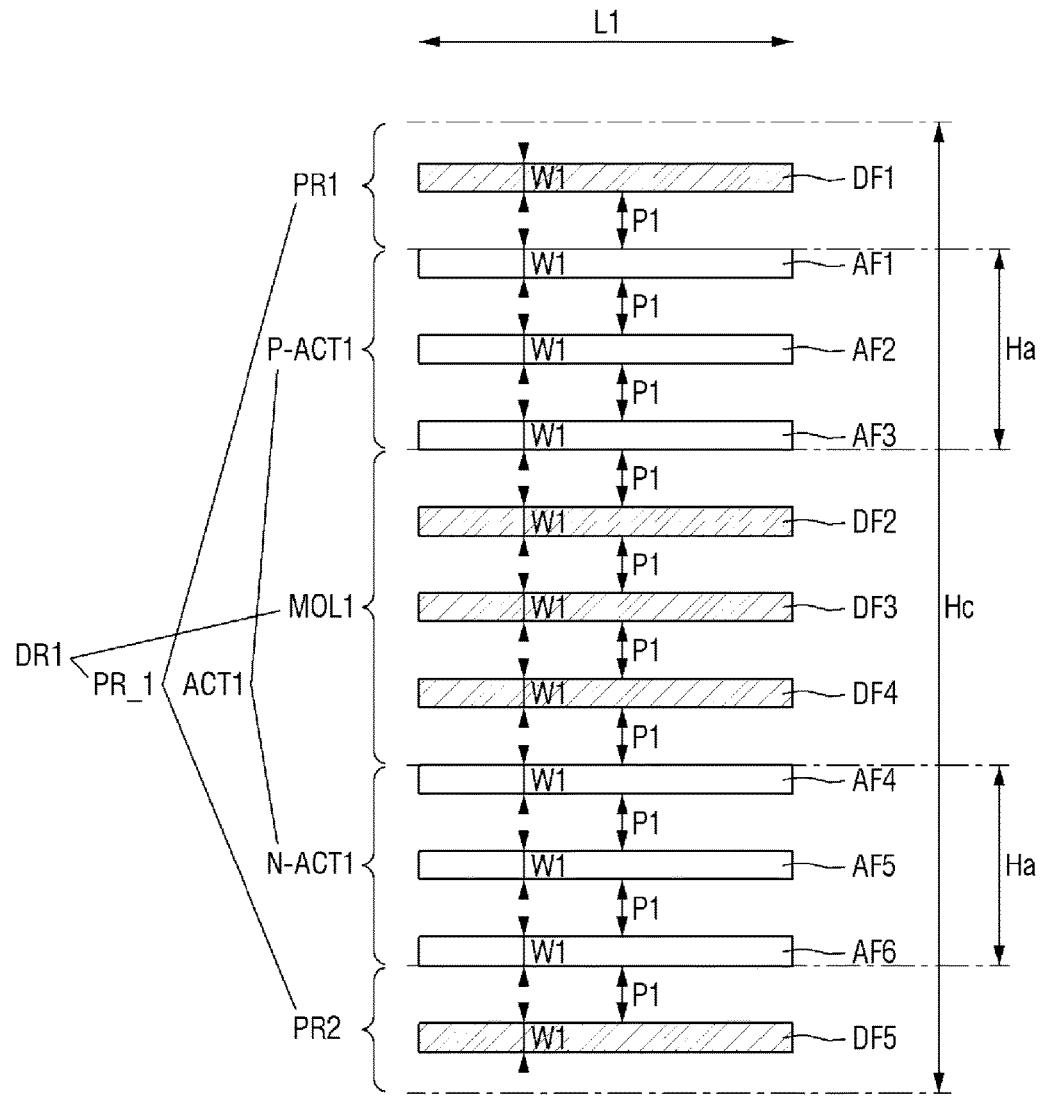
FIG. 5 is a layout diagram provided to explain in detail the first layout of FIG. 3.
Figure 6:
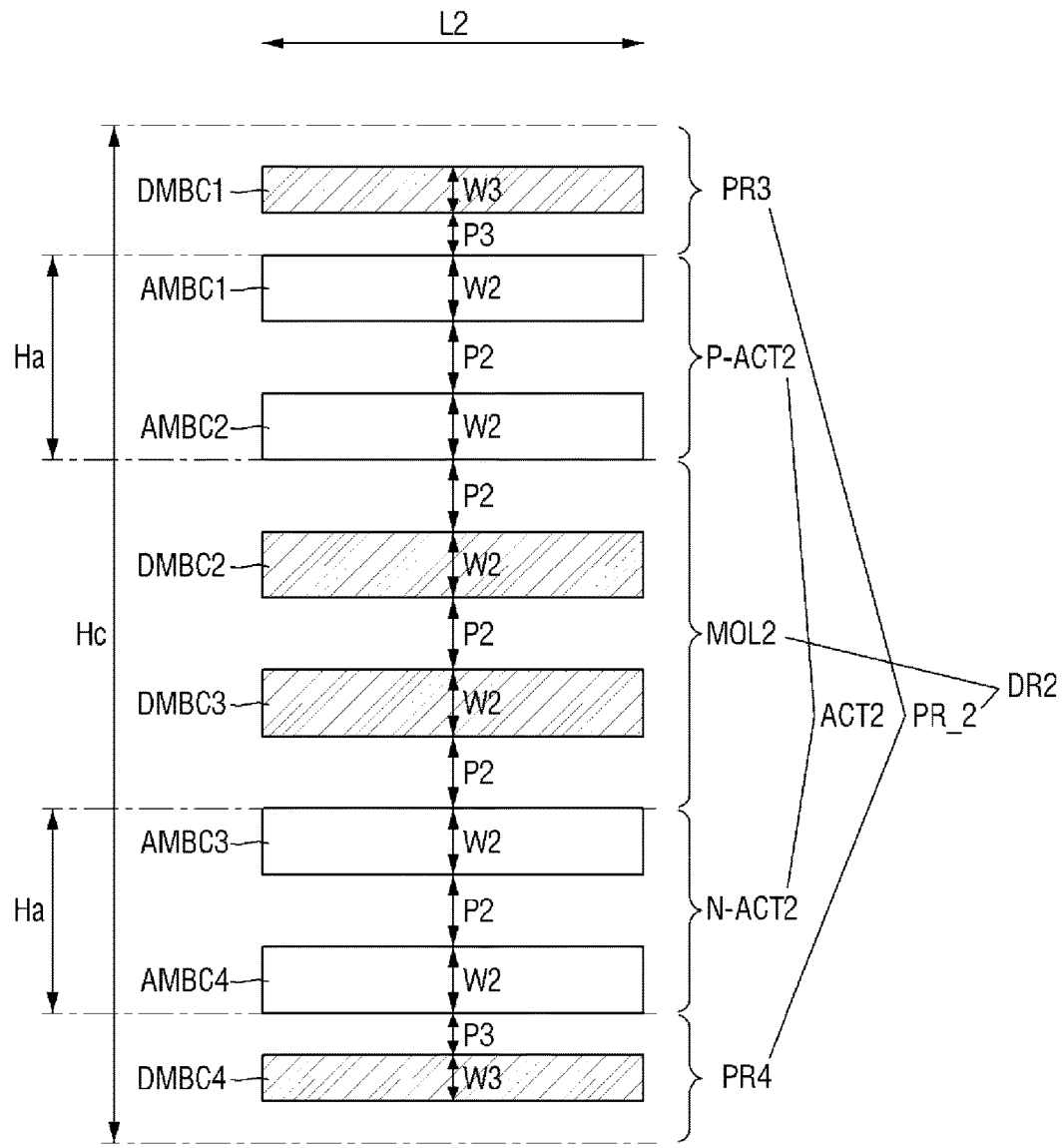
FIG. 6 is a layout diagram provided to explain in detail the second layout of FIG. 3.
Figure 7:
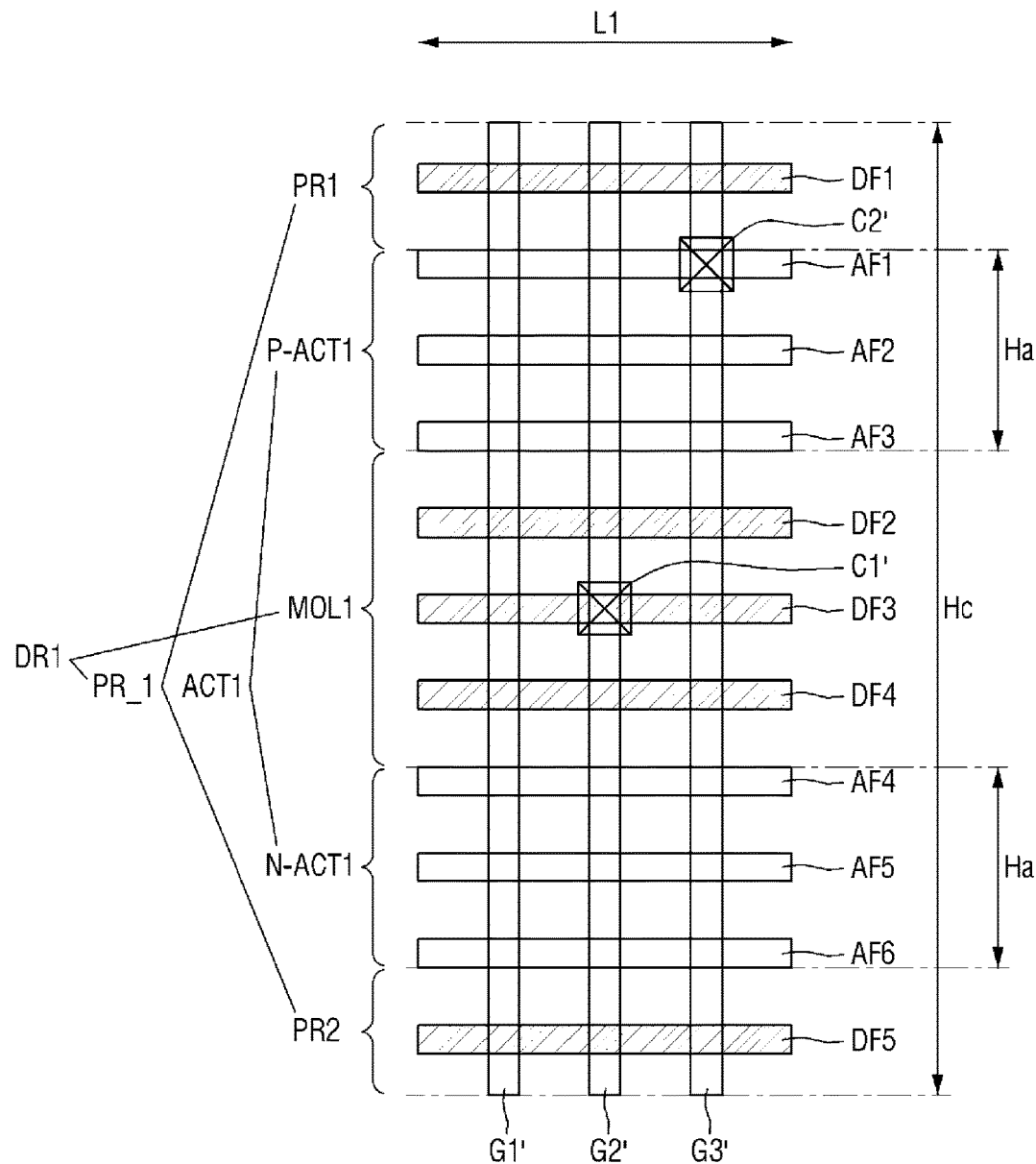
FIG. 7 is a layout diagram provided to explain in detail an upper structure layout being overlapped with the first layout of FIG. 5.
Figure 8:
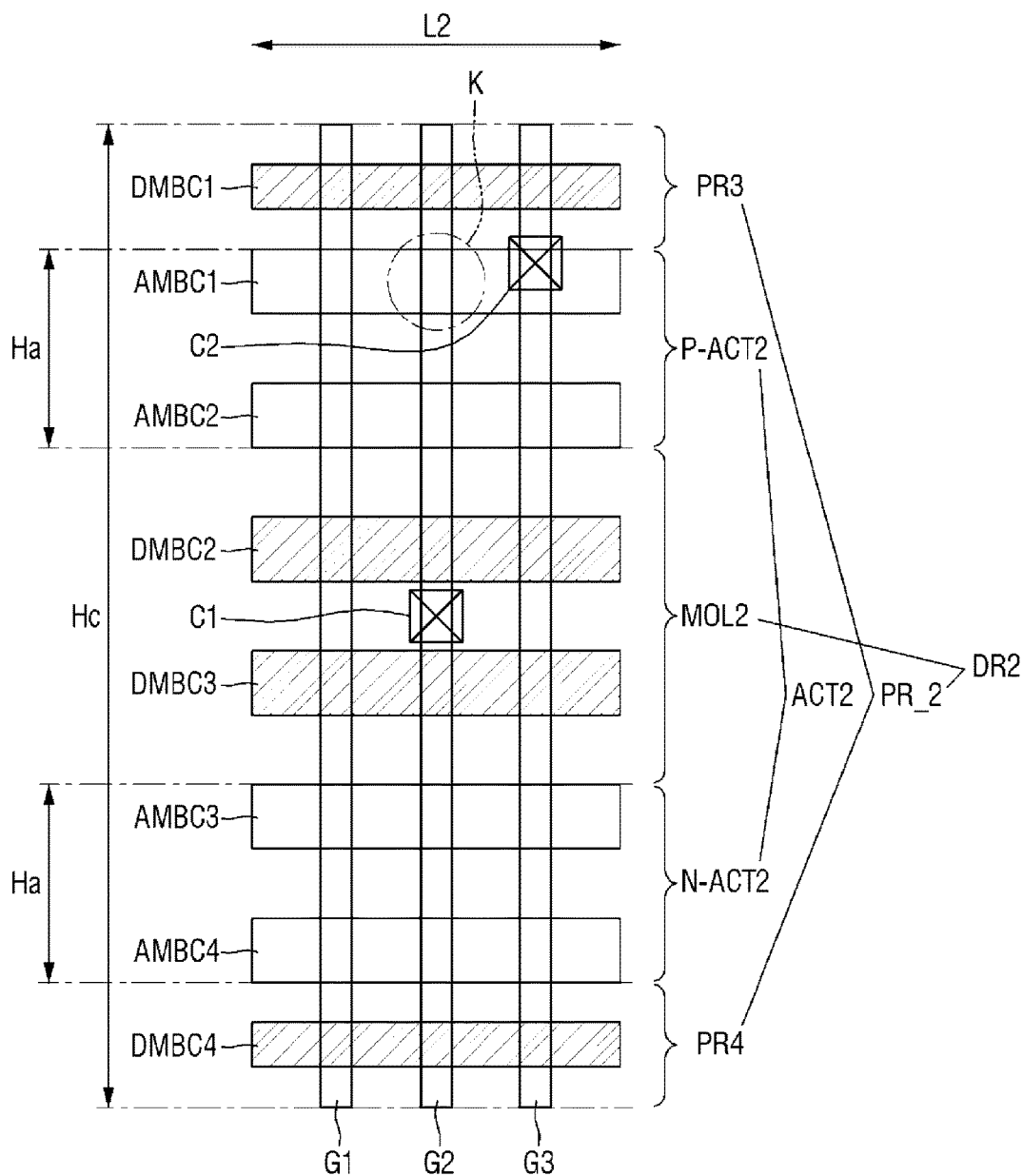
FIG. 8 is a layout diagram provided to explain in detail an upper structure layout being overlapped with the second layout of FIG. 6.
Figure 9:
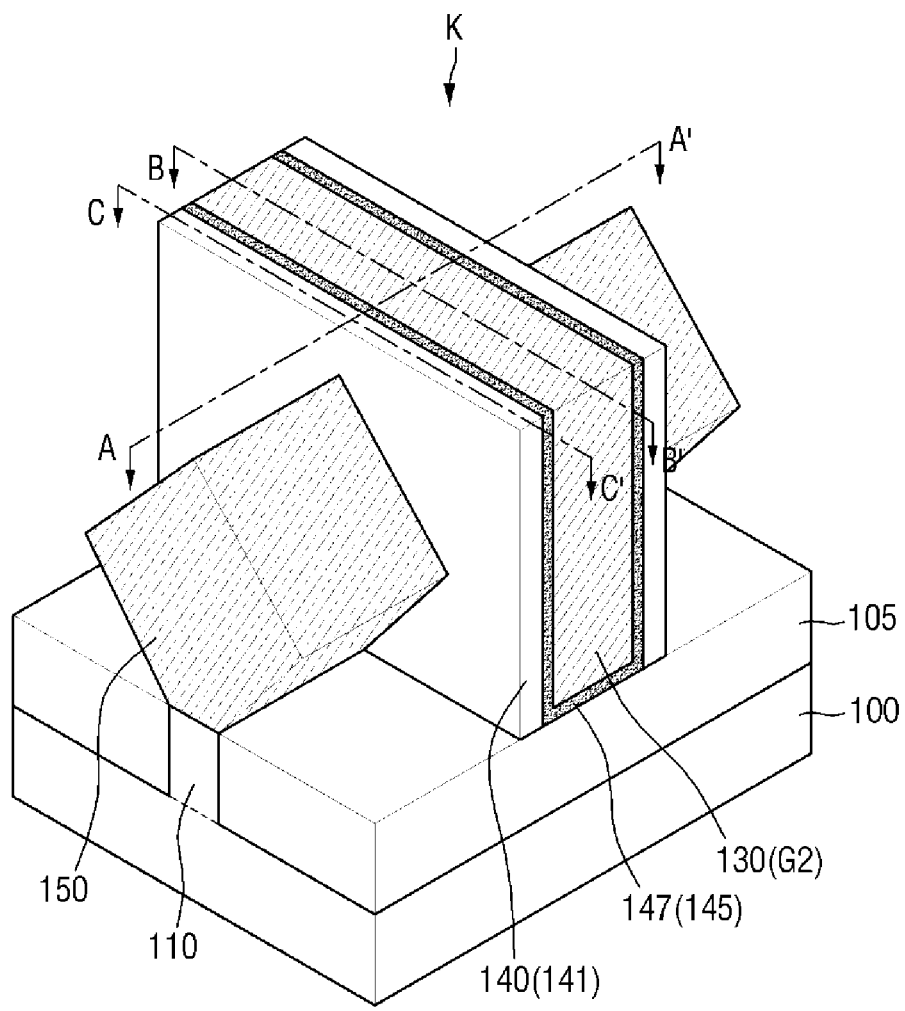
FIG. 9 is a perspective view provided to explain a semiconductor device formed at the encircled section K of FIG. 8 according to some exemplary implementations.
Figure 10:
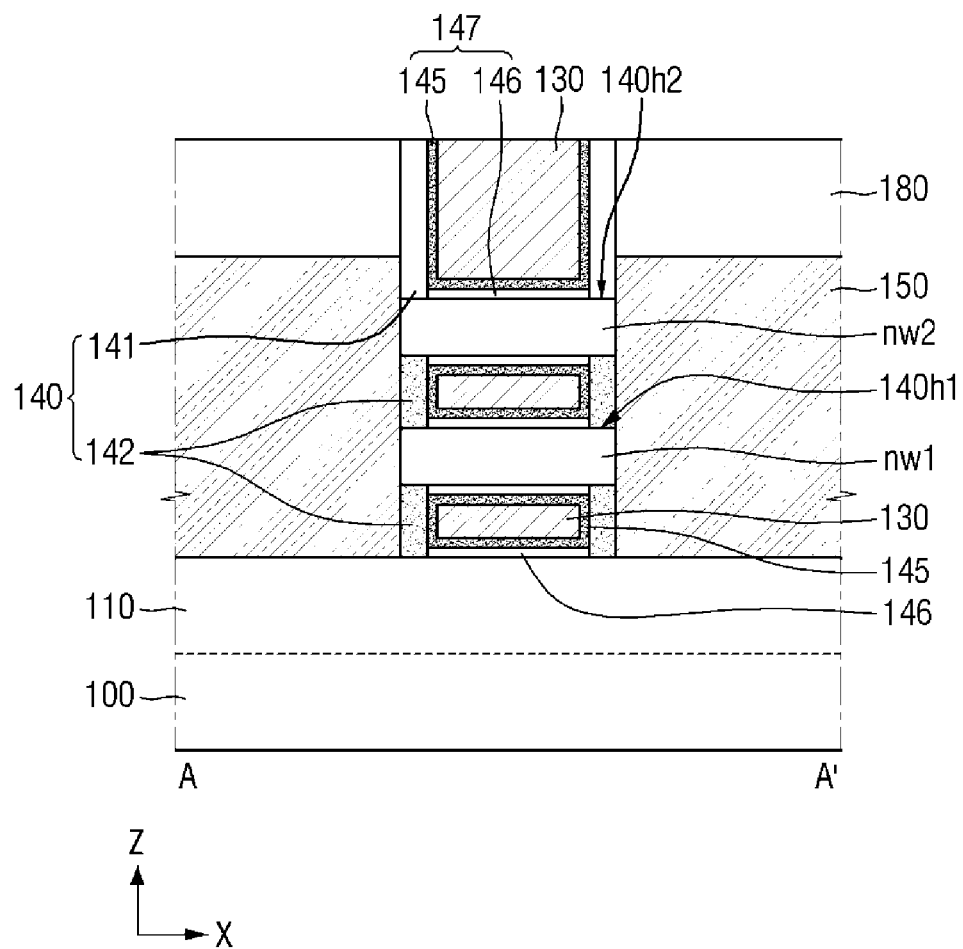
FIG. 10 is a cross sectional view taken on line A-A' of FIG. 9.
Figure 11:
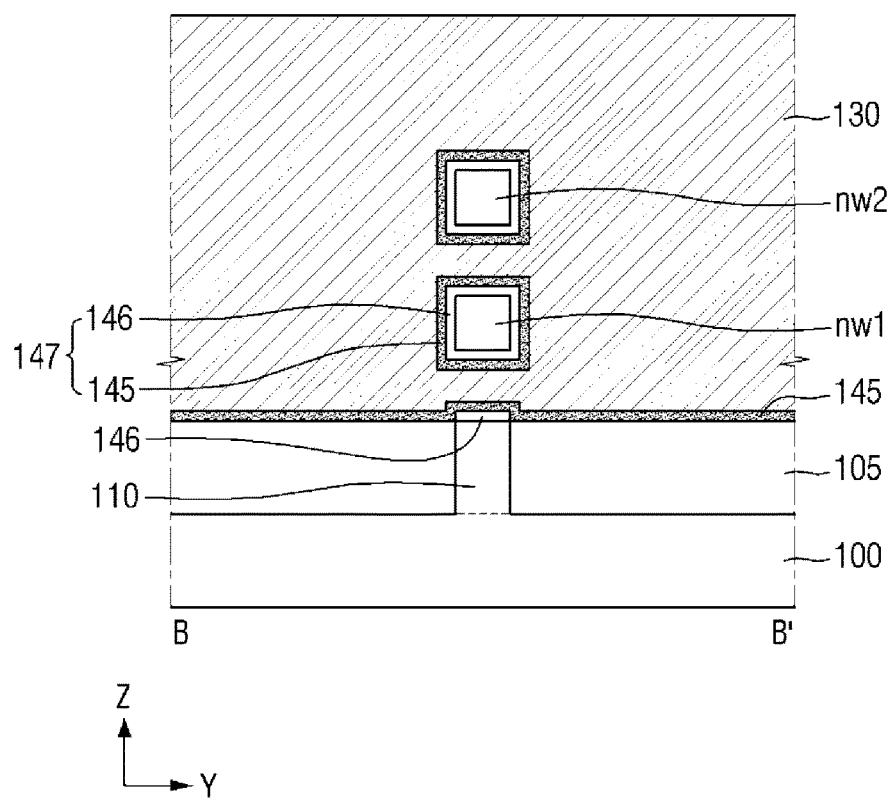
FIG. 11 is a cross sectional view taken on line B-B' of FIG. 9.
Figure 12:
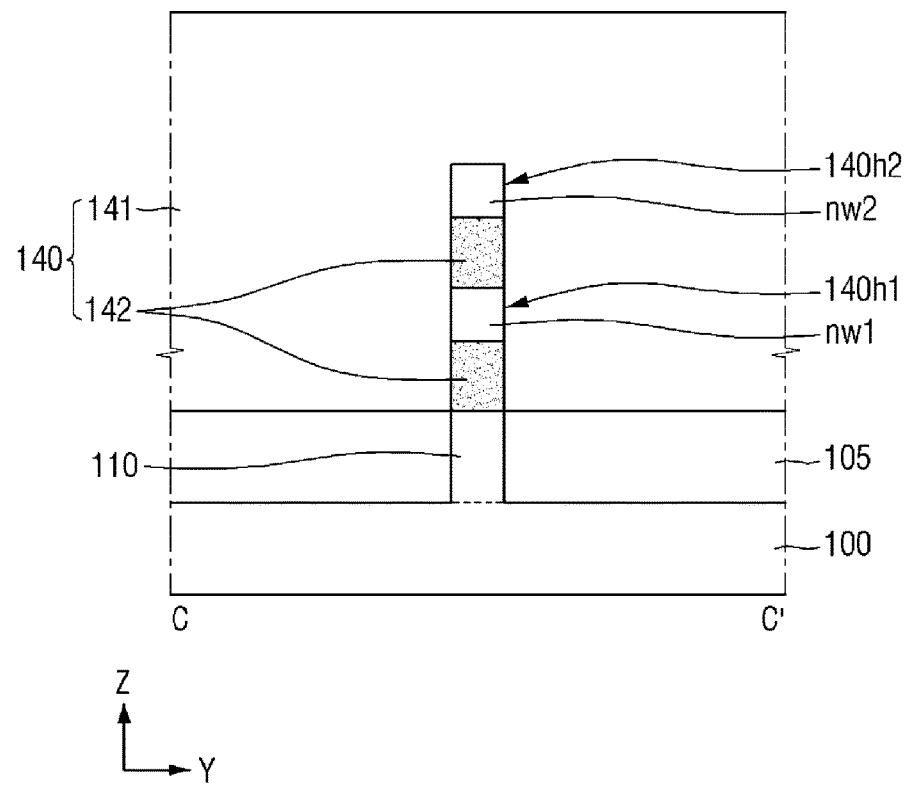
FIG. 12 is a cross sectional view taken on line C-C' of FIG. 9.

FIG. 1 is a block diagram provided to explain a layout design system according to some exemplary implementations, and FIG. 2 is a flowchart provided to explain a fabricating method of a semiconductor device according to some exemplary implementations. FIG. 3 is an exemplary view provided to compare two layouts to explain operations of the re-design module of FIG. 2, and FIG. 4 is an exemplary view provided to compare the first PMOS region and the second PMOS region of FIG. 3. FIG. 5 is a layout diagram provided to explain in detail the first layout of FIG. 3, and FIG. 6 is a layout diagram provided to explain in detail the second layout of FIG. 3. FIG. 7 is a layout diagram provided to explain in detail an upper structure layout being overlapped with the first layout of FIG. 5, and FIG. 8 is a layout diagram provided to explain in detail an upper structure layout being overlapped with the second layout of FIG. 6. FIG. 9 is a perspective view provided to explain a semiconductor device formed at the encircled section K of FIG. 8 according to some exemplary implementations, and FIG. 10 is a cross sectional view taken on line A-A' of FIG. 9. FIG. 11 is a cross sectional view taken on line B-B' of FIG. 9, and FIG. 12 is a cross sectional view taken on line C-C' of FIG. 9.

As shown in FIG. 1, a layout design system according to some exemplary implementations includes a storage 100, a processor 200, and a re-design module 300.

The storage 100 may store a layout. The "layout" as used herein may refer to a design drawing to determine size, arrangement, and connection among the constituent elements of the semiconductor device. However, exemplary implementations are not limited to any specific example.

Accordingly, respective layout designs may be stored at a place other than the storage 100.

The layout may include a shape and an arrangement of patterns to form the semiconductor elements. The layout may store the shapes of the respective patterns as a form of a top view. However, exemplary implementations are not limited to the example given above.

The layout may be designed by a previously-set design rule. The design rule may define shapes, arrangements and pitches of a plurality of patterns. Specifically, the design rule may include pitches among adjacent patterns being a predetermined distance or greater.

According to some exemplary implementations, such storage 100 may be configured as a non-volatile memory device, for example. Examples of such non-volatile memory device may include NAND flash, NOR flash, MRAM, PRAM, RAM, and so on, but are not limited thereto. According to some exemplary implementations, the storage 100 may include a hard disk drive, magnetic memory device, and so on.

When certain arithmetic operations are necessary inside the re-design module 300, the processor 200 may serve to perform the same. Although not illustrated in detail in the drawings, processor 200 may additionally include a cache memory to enhance computing power.

Further, although FIG. 1 shows the processor 200 as one single block, the exemplary implementations are not limited thereto. That is, in some exemplary implementations, the processor 200 may be configured as a multi-core or multi-cluster form. When the processor 200 is configured as a multi-core or multi-cluster form, the computational speed of the re-design module 300 can be enhanced.

Although not illustrated in detail in the drawings, the processor 200 may additionally include a cache memory such as L1, L2, and so on to enhance computing power.

As shown in FIGS. 1 to 8, the re-design module 300 may generate a second layout L2 by using the first layout L1 stored at the storage 100. This will be explained in detail below.

As shown in the flowchart of FIG. 2, re-design module 300 loads the first layout L1, at S100.

The first layout L1 may be stored at the storage 100. The first layout L1 may be a layout drawing to fabricate a semiconductor device. The first layout L1 may include a fin-type pattern design therein.

Specifically, as shown in FIG. 3, the first layout L1 may include eleven fin-type pattern designs. The eleven fin-type pattern designs may include six active fin-type pattern designs AF1-AF6, and five dummy fin-type pattern designs DF1-DF5.

The first layout L1 may represent one cell. The cell height Hc of the first layout L1 may be a predetermined value.

The first layout L1 may include a first active region ACT1 and a first dummy region DR1. The first active region ACT1 may include a first PMOS region P-ACT1 and a first NMOS region N-ACT1. The first PMOS region P-ACT1 may be a region where a P-type MOSFET device is formed. The first NMOS region N-ACT1 may be a region where a N-type MOSFET device is formed. The first PMOS region P-ACT1 and the first NMOS region N-ACT1 may be spaced apart from each other.

The first dummy region DR1 may include a power rail region PR_1 and a first MOL region MOL1. The power rail region PR_1 may include a first power rail region PR1 and a second power rail region PR2. The first power rail region PR1 may be in contact with the first PMOS region P-ACT1, and not with the first NMOS region N-ACT1. That is, the first PMOS region P-ACT1 may be positioned between the first power rail region PR1 and the first MOL region MOL1.

The second power rail region PR2 may be in contact with the first NMOS region N-ACT1, and not with the first PMOS region P-ACT1. That is, the first NMOS region N-ACT1 may be positioned between the second power rail region PR2 and the first MOL region MOL1.

The first MOL region MOL1 may be positioned between the first PMOS region P-ACT1 and the first NMOS region N-ACT1. The first MOL region MOL1 may not be in contact with the first power rail region PR1 and the second power rail region PR2.

The first dummy fin-type pattern design DF1 may be formed in the first power rail region PR1. The dummy fin-type pattern designs DF1-DF5 may be the fin-type pattern designs that are not used as active. The fifth dummy fin-type pattern design DF5 may be formed in the second power rail region PR2.

The first power rail region PR1 and the second power rail region PR2 may play a role of supplying power to the entire cells. For example, the first power rail region PR1 may supply positive power, and the second power rail may supply negative power. However, exemplary implementations are not limited to the example given above.

The first MOL region MOL1 may include second to fourth dummy fin-type pattern designs DF2-DF4. The second to fourth dummy fin-type pattern designs DF2-DF4 may be formed for uniform alignment of the first to sixth active fin-type pattern designs AF1-AF6. That is, since using the double patterning technology (DPT) or the quadruple patterning technology (QPT), and so on may involve forming of dummy fin-type patterns that are not actually used, a design for this may be included in the first layout L1.

The first PMOS region P-ACT1 may include first to third active fin-type pattern designs AF1-AF3. The first NMOS region N-ACT1 may include fourth to sixth active fin-type pattern designs AF4-AF6.

The width of the first PMOS region P-ACT1 may correspond to a predetermined active height Ha. The width of the first NMOS region N-ACT1 may also correspond to the same active height Ha.

The second layout L2 may include a second active region ACT2 and a second dummy region DR2. The second active region ACT2 may include a second PMOS region P-ACT2 and a second NMOS region N-ACT2. The second PMOS region P-ACT2 may be a region where a P-type MOSFET device is formed. The second NMOS region N-ACT2 may be a region where a N-type MOSFET device is formed. The second PMOS region P-ACT2 and the second NMOS region N-ACT2 may be spaced apart from each other.

The second layout L2 may represent one cell. The cell height Hc of the second layout L2 may be a predetermined value. The cell height Hc of the second layout L2 may be the same as the cell height Hc of the first layout.

The second dummy region DR2 may include a power rail region PR_2 and a second MOL region MOL2. The power rail region PR_2 may include a third power rail region PR3 and a fourth power rail region PR4. The third power rail region PR3 may be in contact with the second PMOS region P-ACT2, and not with the second NMOS region N-ACT2. That is, the second PMOS region P-ACT2 may be positioned between the second power rail region PR2 and the second MOL region MOL2.

The fourth power rail region PR4 may be in contact with the second NMOS region N-ACT2, and not with the second PMOS region P-ACT2. That is, the second NMOS region N-ACT2 may be positioned between the fourth power rail region PR4 and the second MOL region MOL2.

The second MOL region MOL2 may be positioned between the second PMOS region P-ACT2 and the second NMOS region N-ACT2. The second MOL region MOL2 may not be in contact with the third power rail region PR3 and the fourth power rail region PR4.

A first dummy nanowire structure design DMBC1 may be formed in the third power rail region PR3. The dummy nanowire structure designs DMBC1-DMBC4 may be the nanowire structure designs that are not used as active. The fourth dummy nanowire structure design DMBC4 may be formed in the fourth power rail region PR4.

The third power rail region PR3 and the fourth power rail region PR4 may play a role of supplying power to the entire cells. For example, the third power rail region PR3 may supply positive power, and the fourth power rail may supply negative power. However, exemplary embodiments are not limited to the example given above.

The second MOL region MOL2 may include the second dummy nanowire structure design DMBC2 and the third dummy nanowire structure design DMBC3. The second dummy nanowire structure design DMBC2 and the third dummy nanowire structure design DMBC3 may be formed for uniform alignment of the first to fourth active fin-type pattern designs AMBC1-AMBC4. That is, since using the double patterning technology (DPT) or the quadruple patterning technology (QPT), and so on may involve forming of dummy fin-type patterns that are not actually used, a design for this may be included in the second layout L2.

The second PMOS region P-ACT2 may include the first and second active nanowire structure designs AMBC1, AMBC2. The second NMOS region N-ACT2 may include the third and fourth active nanowire structure designs AMBC3, AMBC4.

The width of the second PMOS region P-ACT2 may correspond to a predetermined active height Ha. The width of the second NMOS region N-ACT2 may also correspond to the same active height Ha. That is, both the cell height Hc and the active height Ha may be identical in the first layout L1 and the second layout L2.

As shown in the flow chart of FIG. 2, the re-design module 300 re-designs the first layout L1 to thus form the second layout L2, at S200.

Unlike the first layout L1, the second layout L2 may not include a fin-type pattern design therein. In the second layout L2, the fin-type pattern design of the first layout L1 may be removed and a nanowire structure may be added. The nanowire structure may be a multi-bridge channel (MBC) FET element.

Specifically, as shown in FIGS. 3 and 4, the first PMOS region P-ACT1 may be replaced with the second PMOS region P-ACT2. The first to third active fin-type patterns AF1-AF3 of the first PMOS region P-ACT1 may be substituted with the first and second active nanowire structures AMBC1, AMBC2 of the second PMOS region P-ACT2.

Because the active height Ha of the first PMOS region P-ACT1 and the active height Ha of the second PMOS region P-ACT2 are identical, there may be a certain limit in substituting the first to third active fin-type pattern designs AF1-AF3 with the first and second active nanowire structure designs AMBC1, AMBC2.

That is, a distance as a sum of the widths of the first to third active fin-type pattern designs AF1-AF3 and the pitch among the first to third active fin-type pattern designs AF1-AF3 may be equal to a distance as a sum of the widths of the first and second active nanowire structure designs AMBC1, AMBC2 and the pitch between the first and second active nanowire structure designs AMBC1, AMBC2. That is, the distances have to be equal to the active height Ha.

The first NMOS region N-ACT1 may be replaced with the second NMOS region N-ACT2. The fourth to sixth active fin-type patterns AF4-AF6 of the first NMOS region N-ACT1 may be substituted with the third and fourth active nanowire structures AMBC3, AMBC4 of the second NMOS region N-ACT2.

Because the active height Ha of the first NMOS region N-ACT1 and the active height Ha of the second NMOS region N-ACT2 are equal, there may be a certain limit in substituting the fourth to sixth active fin-type pattern designs AF4-AF6 with the third and fourth active nanowire structure designs AMBC3, AMBC4.

That is, a distance as a sum of the widths of the fourth to sixth active fin-type pattern designs AF4-AF6 and the pitch among the fourth to sixth active fin-type pattern designs AF4-AF6 may be equal to a distance as a sum of the widths of the third and fourth active nanowire structure designs AMBC3, AMBC4 and the pitch between the third and fourth active nanowire structure designs AMBC3, AMBC4. That is, the distances have to be equal to the active height Ha.

In order to increase the integration density of a semiconductor device, the width of the fin-type pattern will have to be gradually narrowed. However, there may be a limit due to issues associated with the process. Instead, when the fin-type pattern is substituted with a form of a multi-bridge channel stacked with nanowires, several channels are formed vertically. In this case, a smaller number of nanowire structures than the fin-type pattern designs may be substituted. Accordingly, the width of each of the nanowire structures may be formed relatively wider than the width of each of the fin-type patterns. As a result, the limit associated with the process can be overcome.

Further, the nanowire structure may have a greater width than the fin-type pattern such that the semiconductor device according to some exemplary implementations may have a reduced fringing capacitance. That is, compared to a semiconductor device fabricated with the first layout L1, a semiconductor device fabricated with the second layout L2 generated by a layout design system according to some exemplary implementations may have enhanced alternating current (AC) performance.

As shown in FIG. 5, the first layout L1 may include uniform alignment. That is, the first dummy fin-type pattern design DF1, the first to third active fin-type pattern designs AF1-AF3, the second to fourth dummy fin-type pattern designs DF2-DF4, the fourth to sixth active fin-type pattern designs AF4-AF6, and the fifth dummy fin-type pattern design DF5 may be sequentially disposed in parallel.

The first dummy fin-type pattern design DF1, the first to third active fin-type pattern designs AF1-AF3, the second to fourth dummy fin-type pattern designs DF2-DF4, the fourth to sixth active fin-type pattern designs AF4-AF6, and the fifth dummy fin-type pattern design DF5 may all have the same first width W1. The first dummy fin-type pattern design DF1, the first to third active fin-type pattern designs AF1-AF3, the second to fourth dummy fin-type pattern designs DF2-DF4, the fourth to sixth active fin-type pattern designs AF4-AF6, and the fifth dummy fin-type pattern design DF5 may all be spaced apart from one another by the same first pitch P1.

As shown in FIG. 6, the second layout L2 may include uniform alignment. That is, the first dummy nanowire structure design DMBC1, the first and second active nanowire structure designs AMBC1, AMBC2, the second and third dummy nanowire structure designs DMBC2, DMBC3, the third and fourth active nanowire structure designs AMBC3, AMBC4, and the fourth dummy nanowire structure design DMBC4 may be sequentially disposed in parallel.

That is, the first and second active nanowire structure designs AMBC1, AMBC2, the second and third dummy nanowire structure designs DMBC2, DMBC3, and the third and fourth active nanowire structure designs AMBC3, AMBC4 may all have the same second width W2. The second width W2 may be equal to or greater than two times the first width W1, or equal to or less than four times the first width W1.

The first and second active nanowire structure designs AMBC1, AMBC2, the second and third dummy nanowire structure designs DMBC2, DMBC3, and the third and fourth active nanowire structure designs AMBC3, AMBC4 may be spaced apart from one another by a second pitch P2. The second pitch P2 may be a remainder left after subtracting two times the second width W2 from the active height Ha.

The first dummy nanowire structure design DMBC1 of the third power rail region PR3, and the fourth dummy nanowire structure design DMBC4 of the fourth power rail region PR4 may have a third width W3 different from the second width W2.

Further, the third pitch P3 between the first dummy nanowire structure design DMBC1 and the first active nanowire structure design AMBC1 may be different from the second pitch P2. Further, the third pitch P3 between the fourth dummy nanowire structure design DMBC4 and the fourth active nanowire structure design AMBC4 may be different from the second pitch P2.

As shown in FIG. 7, an upper structure layout, having a plurality of first gate electrode designs G1'-G3' and first contact designs C1', C2', may be overlapped on the first layout L1. The upper structure layout may represent locations and arrangements of the designs including gate electrodes, contacts, and so on formed on the fin-type pattern.

Specifically, the first gate electrode designs G1'-G3' may be extended in a direction of intersecting with the directions in which the fin-type pattern designs are extended. The first contact designs C1', C2' may be formed in the first active region ACT1 and the first dummy region DR1. However, the locations and number of the first contact designs C1', C2' illustrated herein are provided only as an example, and exemplary implementations are not limited thereto.

As shown in FIG. 8, an upper structure layout, having a plurality of second gate electrode designs G1-G3 and second contact designs C1, C2, may be overlapped on the second layout L2. The upper structure layout may represent locations and arrangements of the designs including gate electrodes, contacts, and so on formed on the fin-type pattern.

Specifically, the second gate electrode designs G1-G3 may be extended in a direction of intersecting with the directions in which the fin-type pattern designs are extended. The second contact designs C1, C2 may be formed in the second active region ACT2 and the second dummy region DR2. However, the locations and number of the second contact designs C1, C2 illustrated herein are provided only as an example, and exemplary implementations are not limited thereto.

As illustrated in FIGS. 7 and 8, the upper structure layout may not be modified at all and applied to the second layout. That is, a semiconductor device may be fabricated by using the second layout L2 as a re-designed layout of the first layout L1, and the upper structure layout. That is, the second layout L2 may completely replace the first layout L1. As a result, a fabricating method of a semiconductor device according to some exemplary implementations can minimize waste in the design planning process and efficiently fabricate the semiconductor device.

As shown in FIG. 2, the nanowire structure is formed by using the second layout L2, at S300.

FIGS. 9 to 12 are views provided to explain the nanowire structure formed in the encircled section K of FIG. 8. That is, FIG. 9 is a perspective view provided to explain a semiconductor device formed at the encircled section K of FIG. 8 according to some exemplary implementations, and FIG. 10 is a cross sectional view taken on line A-A' of FIG. 9. FIG. 11 is a cross sectional view taken on line B-B' of FIG. 9, and FIG. 12 is a cross sectional view taken on line C-C' of FIG. 9.

As shown in FIGS. 9 to 12, a nanowire structure of a semiconductor device according to some exemplary implementations may include a substrate 100, a fin-type pattern 110, a first nanowire nw1, a gate electrode 130, a gate spacer 140, a source/drain 150, and so on.

The substrate 100 may be, for example, a bulk silicon or a silicon-on-insulator (SOI). Alternatively, the substrate 100 may be a silicon substrate, or may include other material such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The fin-type pattern 110 may protrude from the substrate 100. The field insulating film 105 may at least partially cover the sidewall of the fin-type pattern 110. The fin-type pattern 110 may be defined by the field insulating film 105. The field insulating film 105 may include, for example, one of oxide film, nitride film, oxynitride film, or a combination thereof.

As illustrated in FIG. 9, the sidewall of the fin-type pattern 110 may be entirely surrounded by the field insulating film 105, but note that this is only for illustrative purpose, and exemplary implementations are not limited thereto.

The fin-type pattern 110 may be elongated in a first direction X. That is, the fin-type pattern 110 may include a long side that extends along the first direction X, and a short side extended in a second direction Y.

The fin-type pattern 110 may be formed by partially etching the substrate 100, and may include an epitaxial layer grown from the substrate 100. The fin-type pattern 110 may include an element semiconductor material such as silicon or germanium, for example. Further, the fin-type pattern 110 may include a compound semiconductor such as, for example, Iv-Iv group compound semiconductor or III-V group compound semiconductor.

For example, in the case of the IV-IV group compound semiconductor, the fin-type pattern 110 may be a binary compound or a ternary compound including at least two or more of carbon (C), silicon (Si), germanium (Ge) or tin (Sn), or these compounds doped with IV group element.

In the case of the III-V group compound semiconductor, for example, the fin-type pattern 110 may be a binary, ternary or quaternary compound which is formed by combination of at least one III group element selected from aluminum (Al), gallium (Ga), and indium (In), with one V group element selected from phosphorus (P), arsenic (As) and antimony (Sb).

In the following description, it is assumed that the fin-type pattern 110 of a semiconductor device according to exemplary implementations includes silicon.

The first nanowire nw1 may be formed on the substrate 100, while being spaced apart from the substrate 100. The first nanowire nw1 may be extended in the first direction X.

Specifically, the first nanowire nw1 may be formed on the fin-type pattern 110, while being spaced apart from the fin-type pattern 110. The first nanowire nw1 may overlap with the fin-type pattern 110. The first nanowire nw1 may be formed on the fin-type pattern 110, rather than being formed on the field insulating film 105.

As illustrated in FIG. 11, the width of the first nanowire nw1 in the second direction Y may be equal to the width of the fin-type pattern 110 in the second direction Y, but note that this is illustrated only for convenience of explanation and exemplary implementations are not limited thereto. Further, although it is illustrated that the first nanowire nw1 has a square cross section, exemplary implementations are not limited thereto. Of course, the corner of the first nanowire nw1 may be rounded by trimming, and so on.

The first nanowire nw1 may be used as a channel region for the transistor. The materials for the first nanowire nw1 may vary depending on whether the semiconductor device is a PMOS or an NMOS, but exemplary implementations are not limited thereto.

Further, the first nanowire nw1 may include the same material as that of the fin-type pattern 110, or include a material different from that of the fin-type pattern 110. However, for convenience of explanation, it will be assumed herein that the first nanowire nw1 of the semiconductor device according to exemplary implementations each includes silicon.

The second nanowire nw2 may be formed on the substrate 100, while being spaced apart from the substrate 100. The second nanowire nw2 may be extended in the first direction X.

The second nanowire nw2 may be spaced apart from the substrate 100 farther than the first nanowire nw1 may be. That is, the height from the upper surface of the fin-type pattern 110 to the second nanowire nw2 is greater than the height from the upper surface of the fin-type pattern 110 to the first nanowire nw1.

The second nanowire nw2 may be overlapped with the fin-type pattern 110. The second nanowire nw2 may be formed on the fin-type pattern 110, rather than being formed on the field insulating film 105.

The second nanowire nw2 may be used as a channel region for the transistor. Accordingly, the second nanowire nw2 may include the same material as the first nanowire nw1.

The gate electrode 130 may be formed on the field insulating film 105 and the fin-type pattern 110. The gate electrode 130 may be extended in the second direction Y.

The gate electrode 130 may be so formed as to surround the periphery of the first nanowire nw1 which is spaced apart from an upper surface of the fin-type pattern 110. The gate electrode 130 may also be formed in a space defined between the first nanowire nw1 and the fin-type pattern 110.

The gate electrode 130 may be formed to surround the periphery of the second nanowire nw2. The gate electrode 130 may be formed in a space defined between the first nanowire nw1 and the second nanowire nw2.

The gate electrode 130 may include a conductive material. As illustrated, the gate electrode 130 may be a single layer, but not limited thereto. That is, the gate electrode 130 may include a work function conductive layer which adjusts work function, and a filling conductive layer which fills a space formed by the work function conductive layer for work function adjustment.

For example, the gate electrode 130 may include at least one of TiN, WN, TaN, Ru, TiC, TaC, Ti, Ag, Al, TiAl, TiAlN, TiAlC, TaCN, TaSiN, Mn, Zr, W, and Al. Alternatively, the gate electrode 130 may each be formed of non-metal element such as Si, SiGe, and so on. For example, the gate electrode 130 described above may be formed by replacement process, but not limited thereto.

As shown in FIG. 12, gate spacers 140 may be formed on opposite sidewalls of the gate electrode 130 extended in the second direction Y. The gate spacers 140 may be formed on opposite sides of the first nanowire nw1, while facing each other. The gate spacers 140 may each include through holes 140$h$1, 140$h$2.

The gate spacers 140 may be disposed on opposite ends of the first nanowire nw1 and on opposite ends of the second nanowire nw2. The gate spacers 140 may each include a plurality of through holes 140$h$1, 140$h$2.

The first nanowire nw1 may be passed through the gate spacer 140. The first nanowire nw1 may be passed through the through hole 140$h$1. The gate spacer 140 may be entirely in contact with a periphery of a portion of the side surface of the first nanowire nw1.

The second nanowire nw2 may be passed through the gate spacer 140. The second nanowire nw2 may be passed through one through hole 140$h$2 of a plurality of through holes 140$h$1, 140$h$2. The periphery of the end of the second nanowire nw2 may be in contact with the gate spacer 140.

When the corner of the first nanowire nw1 surrounded by the gate electrode 130 is rounded by, for example, a trimming process, the portion of the side surface of the first nanowire nw1 in contact with the gate spacer 140 may have a cross section different from a cross section of the first nanowire nw1 surrounded by the gate electrode 130.

Like the first nanowire nw1, when the corner of the second nanowire nw2 surrounded by the gate electrode 130 is rounded by, for example, the trimming process, the end of the second nanowire nw2 in contact with the gate spacer 140 may have a cross section different from a cross section of the second nanowire nw2 surrounded by the gate electrode 130.

The gate spacer 140 may be formed on both sides of the gate electrode 130 with reference to the gate electrode 130, and the first nanowire nw1 and the second nanowire nw2 may have the same plane as all the outer sidewalls of the gate spacer 140 on both sides. That is, the ends of the first nanowire nw1 and the second nanowire nw2, and the outer sidewall of the gate spacer 140 may not be protruded.

The second nanowire nw2 may be aligned with the first nanowire nw1. The second nanowire nw2 may be overlapped with the first nanowire nw1 in the third direction Z. The first and second nanowires nw1 and nw2 may have an equal length to each other. However, exemplary implementations are not limited to the example given above. Further, the first nanowire nw1 and the second nanowire nw2 may be aligned in the third direction Z.

The gate spacer 140 may include an outer spacer 141 and an inner spacer 142. The outer spacer 141 may be in direct contact with the inner spacer 142. The inner spacer 142 may be disposed between the upper surface of the fin-type pattern 110 and the first nanowire nw1, and between the first nanowire nw1 and the second nanowire nw2. As shown in the Y-Z cross section of FIG. 12, the inner spacer 142 may be surrounded by the first nanowire nw1, the second nanowire nw2, the fin-type pattern 110, and the outer spacer 141.

The inner spacer 142 may be disposed between the upper surface of the fin-type pattern 110 and the first nanowire nw1, and between the first nanowire nw1 and the second nanowire nw2. That is, the inner spacer 142 may include a plurality of insulating patterns spaced apart from each other in the third direction Z.

As illustrated in FIG. 12, the uppermost surface of the second nanowire nw2 may be in contact with the outer spacer 141 and the lowermost surface of the second nanowire nw2 may be in contact with the inner spacer 142, although exemplary implementations are not limited thereto. Accordingly, it is of course possible that the uppermost surface of the second nanowire nw2 and the lowermost surface of the second nanowire nw2 may be in contact with the inner spacer 142.

The outer spacer 141 and the inner spacer 142 may include different materials from each other. When the material included in the outer spacer 141 has a first dielectric constant and the material included in the inner spacer 142 has a second dielectric constant, the first and the second dielectric constants may be different from each other.

In the semiconductor device according to an exemplary implementation, the material included in the outer spacer 141 may have a greater dielectric constant than the material included in the inner spacer 142. It is possible to reduce the fringing capacitance between the gate electrode 130 and the source/drain 150 by having the second dielectric constant lower than the first dielectric constant.

For example, the outer spacer 141 may include at least one of silicon nitride (SiN), silicon oxynitride (SiON), silicon oxide (SiO$_2$), silicon oxycarbidenitride (SiOCN), and a combination thereof. For example, the inner spacer 142 may include at least one of a low-k dielectric material, silicon nitride (SiN), silicon oxynitride (SiON), silicon oxide (SiO$_2$), silicon oxycarbidenitride (SiOCN), and a combination thereof. The low-k dielectric material may be the material that has a lower dielectric constant than the silicon oxide.

The gate insulating film 147 may be formed between the first nanowire nw1 and the gate electrode 130, and between the second nanowire nw2 and the gate electrode 130. The gate insulating film 147 may be formed along the periphery of the second nanowire nw2. Further, the gate insulating film 147 may also be formed between the field insulating film 105 and the gate electrode 130, between the fin-type pattern 110 and the gate electrode 130, and between the gate spacer 140 and the gate electrode 130.

For example, the gate insulating film 147 may include an interfacial film 146 and a high-k insulating film 145, but it is not limited thereto. That is, the interfacial film 146 of the gate insulating film 147 may be omitted depending on a material for the first nanowire nw1, and so on.

Because the interfacial film 146 may be formed on a periphery of the first nanowire nw1, the interfacial film 146 may be formed between the first nanowire nw1 and the gate electrode 130, and between the fin-type pattern 110 and the gate electrode 130. Meanwhile, the high-k insulating film 145 may be formed between the first nanowire nw1 and the gate electrode 130, between the fin-type pattern 110 and the gate electrode 130, between the field insulating film 105 and the gate electrode 130, and between the gate spacer 140 and the gate electrode 130.

The gate insulating film 147 may be formed along the periphery of the first nanowire nw1 and the second nanowire nw2. The gate insulating film 147 may be formed along the upper surface of the field insulating film 105 and the upper surface of the fin-type pattern 110. Additionally, the gate insulating film 147 may be formed along the sidewall of the gate spacer 140. The gate insulating film 147 may be formed along the sidewalls of the outer spacer 141 and the inner spacer 142.

When the first nanowire nw1 and the second nanowire nw2 include silicon, the interfacial film 146 may include silicon oxide film. At this time, the interfacial film 146 may be formed on the peripheries of the first nanowire nw1 and the second nanowire nw2 and on the upper surface of the fin-type pattern 110, but may not be formed along the sidewall of the gate spacer 140.

The high-k insulating film 145 may include a high-k dielectric material having a higher dielectric constant than silicon oxide film. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

As described above, when the interfacial film 146 is omitted, the high-k insulating film 145 may include not only the high-k dielectric material, but also silicon oxide film, silicon oxynitride film, silicon nitride film, and so on.

The source/drain 150 may be formed on both sides of the gate electrode 130. The source/drain 150 may be formed on the fin-type pattern 110. The source/drain 150 may include an epitaxial layer formed on an upper surface of the fin-type pattern 110.

An outer circumference of the source/drain 150 may take on a variety of shapes. For example, the outer circumference of the source/drain 150 may be shaped to be at least one of a diamond, circle, rectangle, and octagon. FIG. 9 illustrates a diamond shape (or pentagon or hexagon shape) for example.

The source/drain 150 may be directly connected with the first nanowire nw1 and the second nanowire nw2 being used as a channel region. That is, the source/drain 150 may be directly connected with the first nanowire nw1 and the second nanowire nw2 passed through the through holes 140h1, 140h2 of the gate spacer 140.

However, the source/drain 150 may not be in direct contact with the gate insulating film 147. The gate spacer 140 may be positioned between the source/drain 150 and the gate insulating film 147. More specifically, because one sidewall of the inner spacer 142 may be in contact with the gate insulating film 147, while the other sidewall of the inner spacer 142 may be in contact with the source/drain 150, the source/drain 150 and the gate insulating film 147 may not be in contact with each other between the first nanowire nw1, the second nanowire nw2 and the substrate 100. Further, since the outer spacer 141 is in contact with the uppermost portion of the first nanowire nw1, the source/drain 150 and the gate insulating film 147 may not be in contact with each other over the first nanowire nw1.

Hereinbelow, a fabricating method of a semiconductor device according to an exemplary embodiment will be explained with reference to FIGS. 10 and 13 to 27. In the following description, description overlapped with the exemplary implementations already provided above will not be described or will be described as briefly as necessary for the sake of brevity.

The semiconductor device fabricated based on FIGS. 13 to 27 corresponds to the semiconductor device described above with reference to FIGS. 9 to 12.

Figure 23:
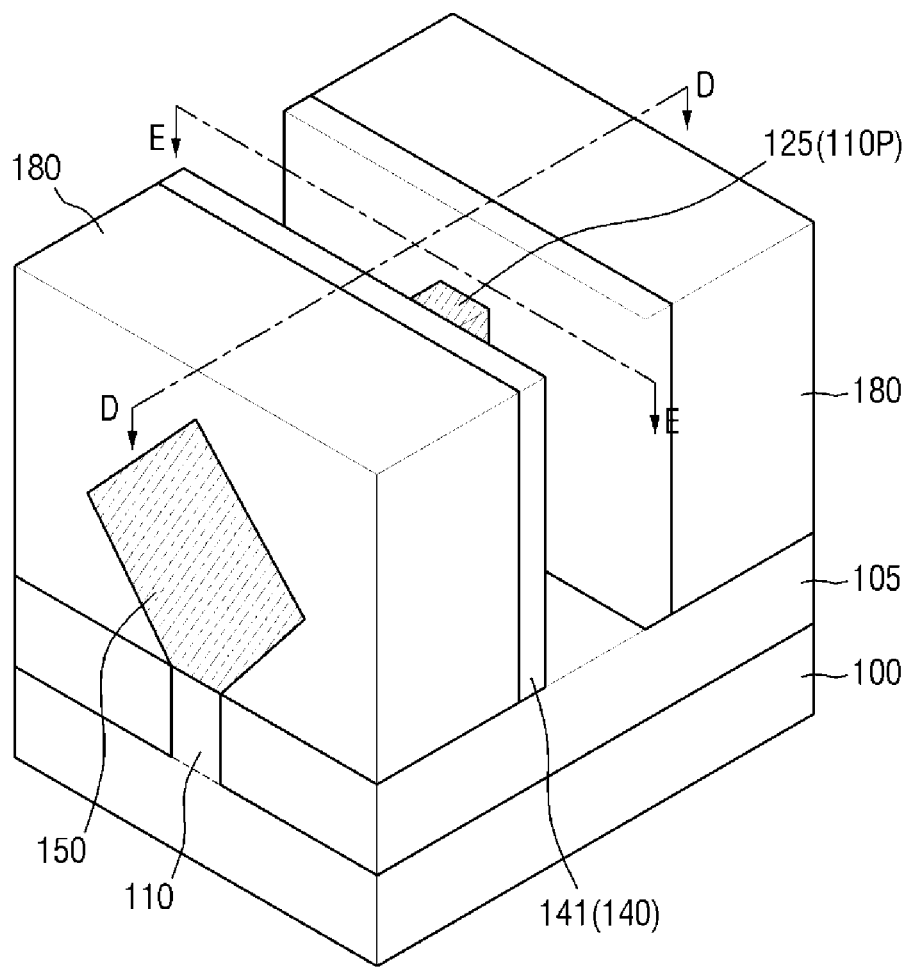
Figure 24:
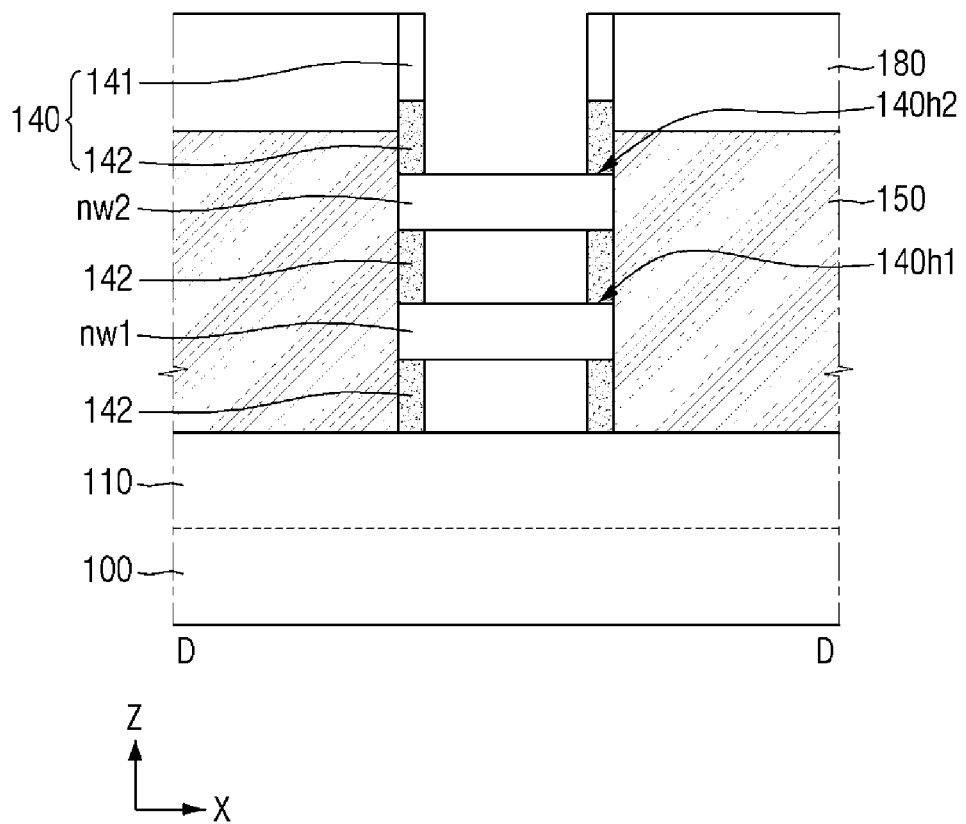
Figure 25:
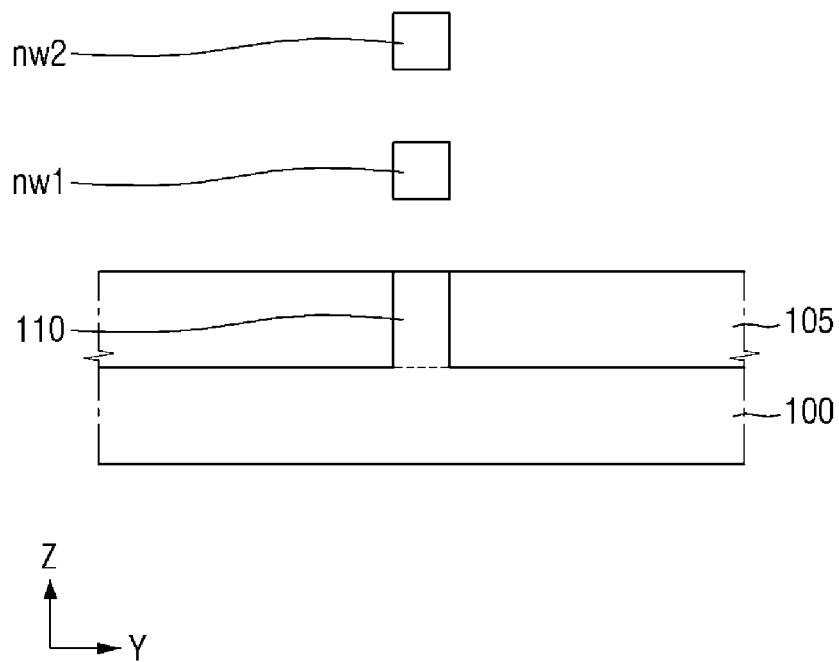

FIGS. 13 to 25 are views illustrating intermediate stages of fabrication, provided to explain a fabricating method of a semiconductor device according to some exemplary implementations. For reference, FIG. 24 is a cross sectional view taken on line D-D of FIG. 23, and FIG. 25 is a cross sectional view taken on line E-E of FIG. 23.

Figure 13:
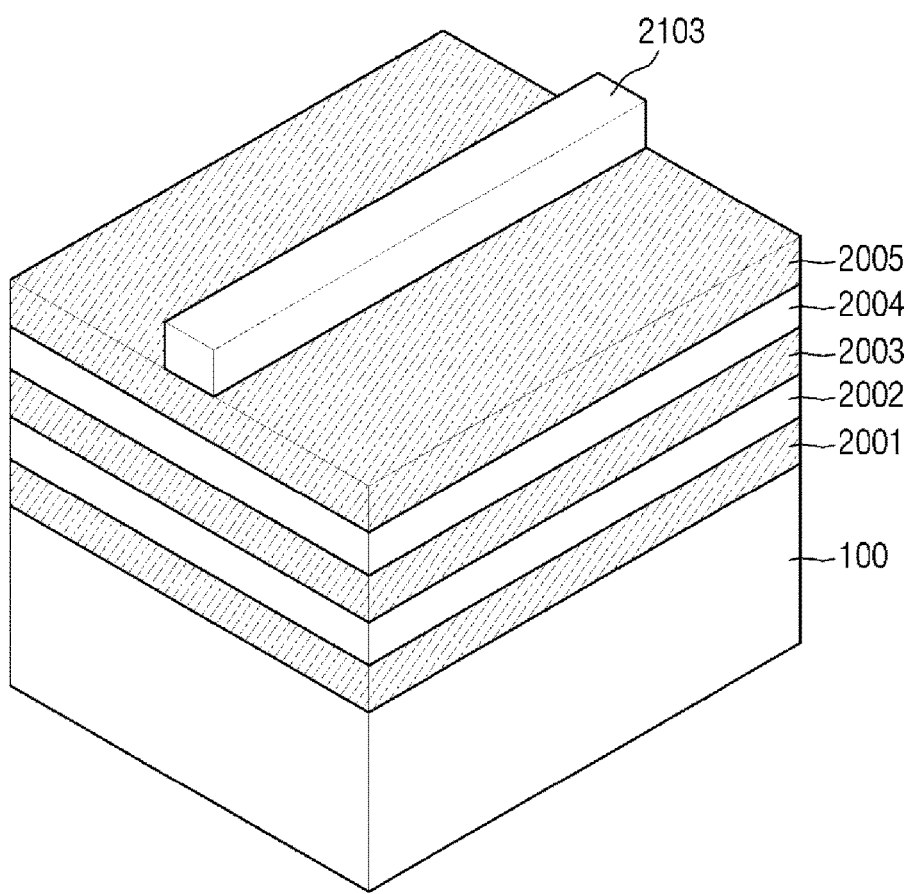
FIGS. 13 to 25 are views illustrating intermediate stages of fabrication, provided to explain a fabricating method of a semiconductor device according to some exemplary implementations.

As shown in FIG. 13, a first sacrificial film 2001, an active film 2002, a second sacrificial film 2003, a second active film 2004, and a third sacrificial film 2005 are formed sequentially on the substrate 100.

The first sacrificial film 2001, the second sacrificial film 2003, and the third sacrificial film 2005 may include the same material, and the first sacrificial film 2001 and the first active film 2002 may include different materials. For the following explanation of a fabricating method of a semiconductor device according to an exemplary implementation, it is assumed that the first to third sacrificial films 2001 to 2005 include the same material. It is further assumed that the first active film 2002 and the second active film 2004 may include a material with an etch selectivity with respect to the first sacrificial film 2001.

For example, the substrate 100, and the first active film 2002 and the second active film 2004 may include a material usable as a channel region for the transistor. That is, in the case of PMOS, the first active film 2002 and the second active film 2004 may include a material of high hole mobility, while in the case of NMOS, the first active film 2002 and the second active film 2004 may include a material with high electron mobility.

The first to third sacrificial films 2001 to 2005 may include a material having a similar lattice constant and lattice structure as the first active film 2002 and the second active film 2004. That is, the first to third sacrificial films 2001 to 2005 may be a semiconductor material, or a crystallized metal material.

In the explanation that follows, it is further assumed that the first active film 2002 and the second active film 2004 include silicon and that the first to third sacrificial films 2001 to 2005 each include silicon germanium.

While FIG. 13 illustrates the first active film 2002 and the second active film 2004 as two films, this is illustrated in this way only for convenience of explanation and the exemplary implementations are not limited thereto.

Further, although FIG. 13 illustrates the third sacrificial film 2005 being positioned on the uppermost portion of the stack film structure, exemplary implementations are not limited thereto. Accordingly, it is of course possible that the second active film 2004 may be positioned on the uppermost portion of the stack film structure.

Next, a first mask pattern 2103 is formed on the third sacrificial film 2005. The first mask pattern 2103 may be elongated in a first direction X.

For example, the first mask pattern 2103 may be formed of a material including at least one of silicon oxide film, silicon nitride film, and silicon oxynitride film.

Figure 14:
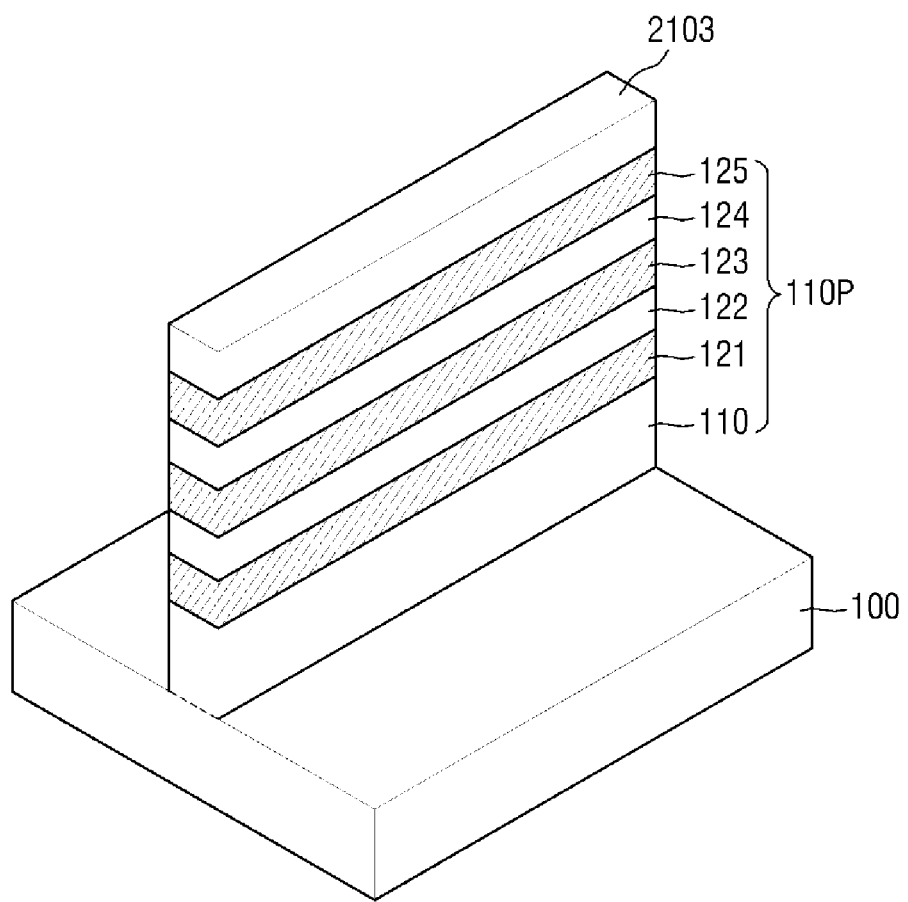

As shown in FIG. 14, an etching process is conducted with the first mask pattern 2103 as a mask, to thus form a fin-type structure 110P.

The fin-type structure 110P may be formed by patterning a portion of the third sacrificial film 2005, the second active film 2004, the second sacrificial film 2003, the first active film 2002, the first sacrificial film 2001, and the substrate 100.

The fin-type structure 110P may be formed on the substrate 100 and protruded from the substrate 100. Similarly to the first mask pattern 2103, the fin-type structure 110P may be extended in the first direction X.

In the fin-type structure 110P, the fin-type pattern 110, the first sacrificial pattern 121, the first pre-wire pattern 122, the second sacrificial pattern 123, the second pre-wire pattern 124, and the third sacrificial pattern 125 may be stacked sequentially on the substrate 100.

Figure 15:
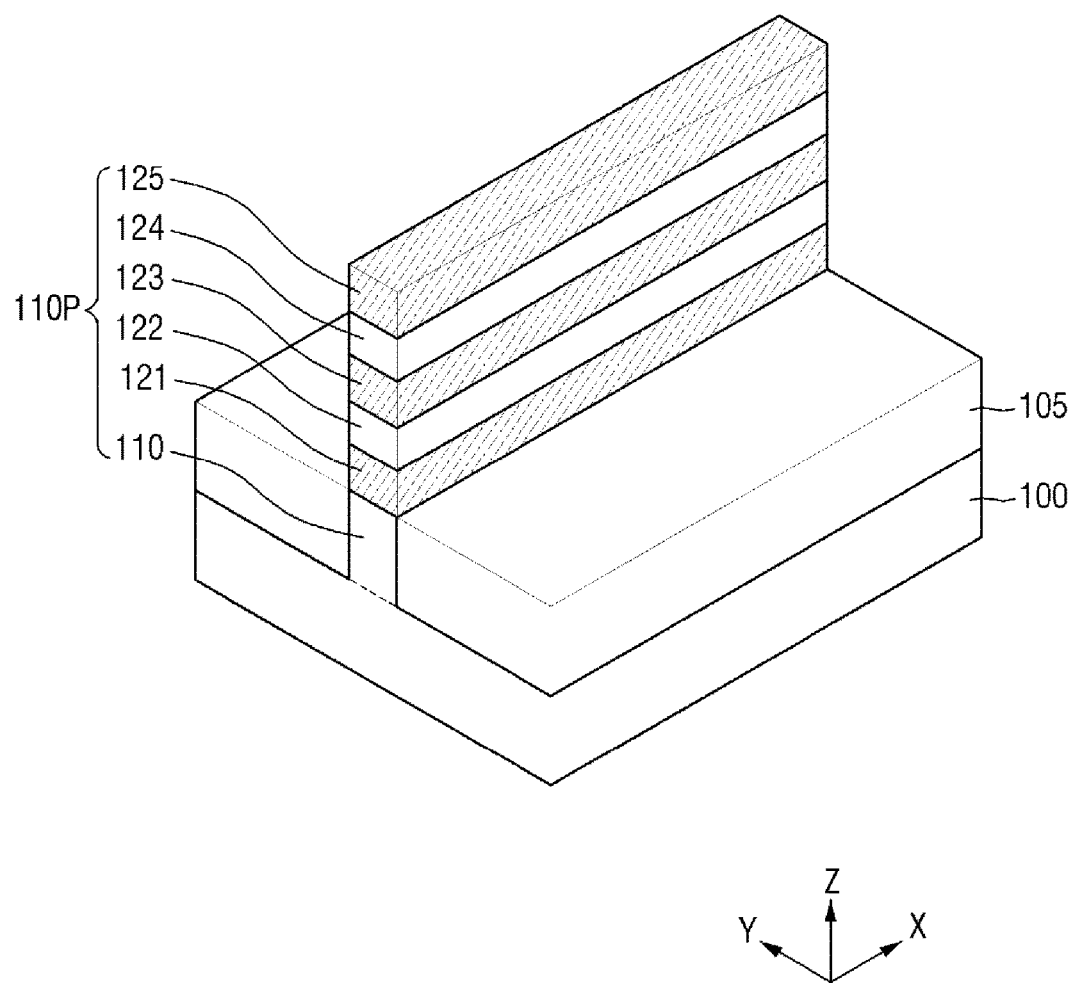

As shown in FIG. 15, the field insulating film 105, covering at least a portion of the sidewall of the fin-type structure 110P, may be formed on the substrate 100.

Specifically, the field insulating film 105 covering the fin-type structure 110P is formed on the substrate 100. With the planarization process of the field insulating film 105, the upper surface of the fin-type structure 110P and the upper surface of the field insulating film 105 may be in the same plane.

The first mask pattern 2103 may be removed in the process of the planarization, but is not limited thereto.

The upper portion of the field insulating film 105 is then recessed, thus exposing a portion of the fin-type structure 110P. The recessing process may include etching process. That is, the fin-type structure 110P may be formed, protruding on the field insulating film 105.

As illustrated in FIG. 15, the third sacrificial pattern 125, the second pre-wire pattern 124, the second sacrificial pattern 123, the first pre-wire pattern 122 and the first sacrificial pattern 121 may be protruded on the upper surface of the field insulating film 105, and the sidewall of the fin-type pattern 110 may be entirely surrounded by the field insulating film 105, but exemplary implementations are not limited thereto. That is, a portion of the sidewall of the fin-type pattern 110 may be protruded on the upper surface of the field insulating film 105 through the upper portion recessing process of the field insulating film 105.

The first pre-wire pattern 122 and the second pre-wire pattern 124 may be doped for the purpose of threshold voltage adjustment, before and/or after the recessing process that causes the portion of the fin-type structure 110P to be protruded upward higher than the upper surface of the field insulating film 105. When the semiconductor device is an NMOS transistor, impurity may be boron (B). When the semiconductor device is a PMOS transistor, the impurity may be phosphorus (P) or arsenic (As), but is not limited thereto.

Figure 16:
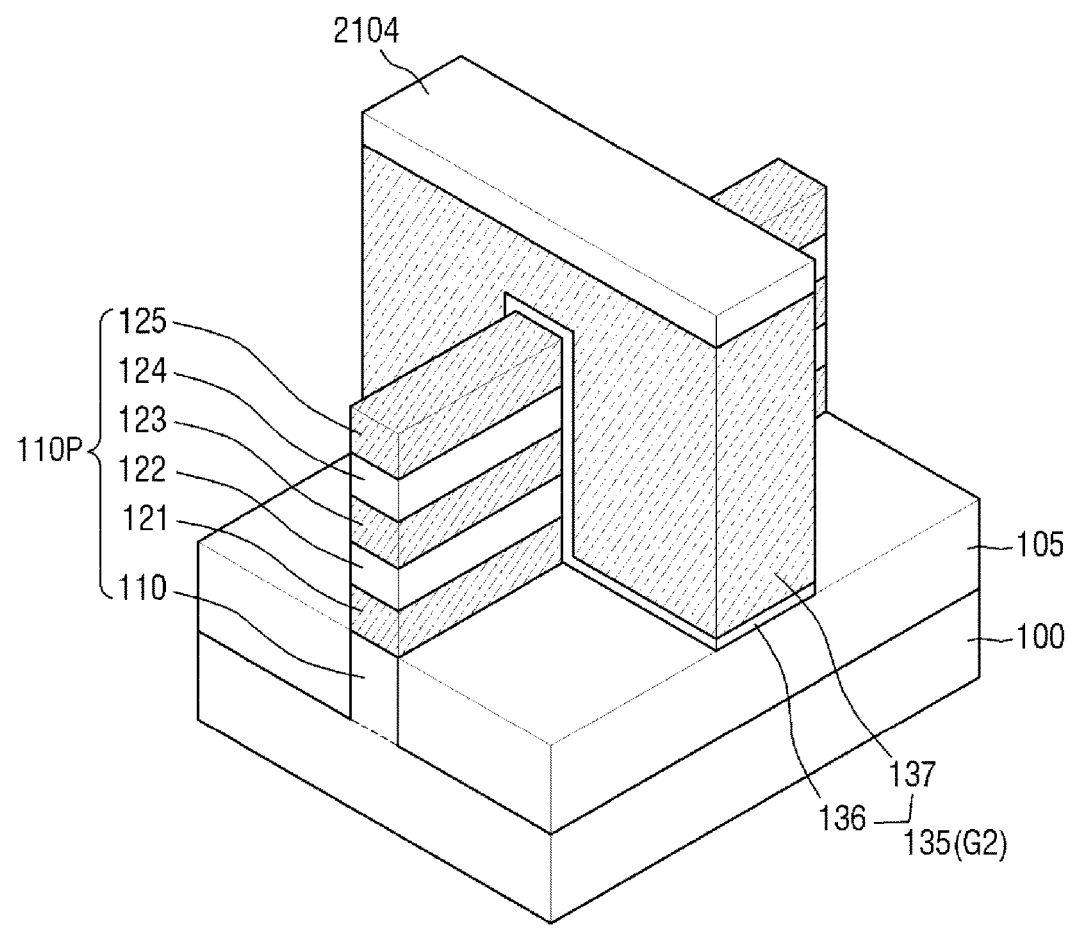

As shown in FIG. 16, a dummy gate pattern 135 intersecting with the fin-type structure 110P and extending in the second direction Y may be formed by performing the etching process with the second mask pattern 2104. The dummy gate pattern 135 may be formed on the fin-type structure 110P.

The dummy gate pattern 135 may include a dummy gate insulating film 136 and a dummy gate electrode 137. For example, the dummy gate insulating film 136 may include a silicon oxide film, and the dummy gate electrode 137 may include polysilicon or amorphous silicon.

Figure 17:
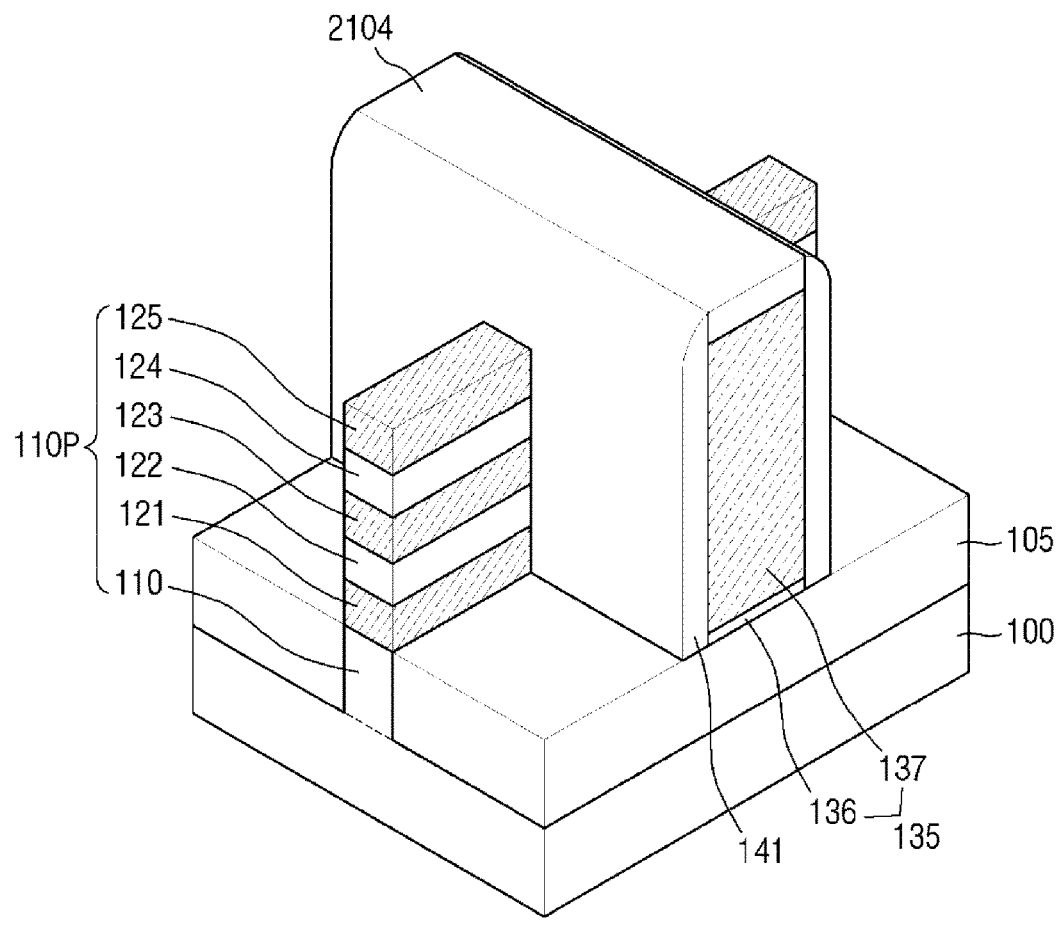

As shown in FIG. 17, the outer spacer 141 may be formed on the sidewall of the dummy gate pattern 135. That is, the outer spacer 141 may be formed on the sidewalls of the dummy gate insulating film 136 and the dummy gate electrode 137.

Specifically, a first spacer film covering the dummy gate pattern 135 and the fin-type structure 110P is formed on the field insulating film 105. The first spacer film may then be etched-back, thus leaving the outer spacer 141 on the sidewall of the dummy gate pattern 135.

Figure 18:
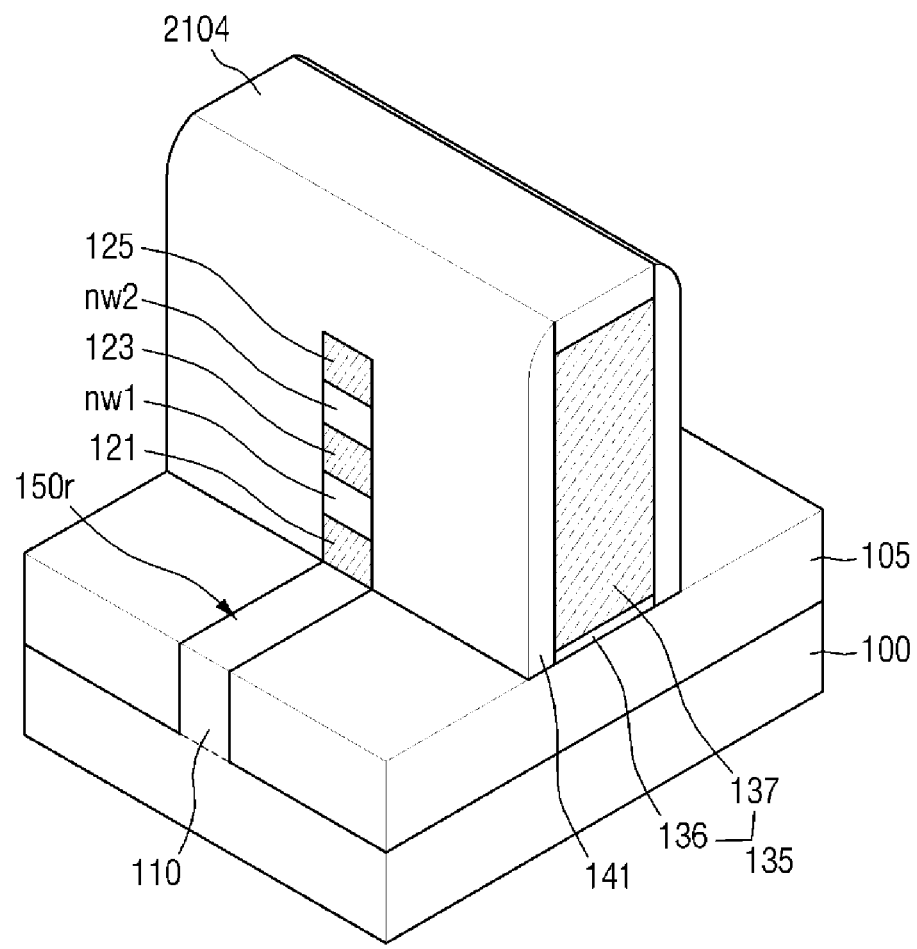

As shown in FIG. 18, the fin-type structure 110P non-overlapped with the dummy gate electrode 137 and the outer spacer 141 is removed by using the dummy gate pattern 135 including the dummy gate electrode 137 as a mask. By doing so, a recess 150r may be formed within the fin-type structure 110P. A bottom surface of the recess 150r may be the fin-type pattern 110.

Forming the outer spacer 141 and forming a recess 150r may be concurrently performed, although exemplary implementations are not limited thereto. That is, the recess 150r may be formed by removing a portion of the fin-type structure 110P, after the outer spacer 141 is formed.

While the recess 150r is being formed in the fin-type structure 110P, the first to third sacrificial patterns 121 to 125 non-overlapped with the dummy gate electrode 137 and the outer spacer 141 may be removed. Further, while the recess 150r is being formed in the fin-type structure 110P, the first nanowire nw1 and the second nanowire nw2 may be formed with the removal of the first pre-wire pattern 122 and the second pre-wire pattern 124 non-overlapped with the dummy gate electrode 137 and the outer spacer 141.

By the presence of the recess 150r, the cross section of the first sacrificial pattern 121, the cross section of the second sacrificial pattern 123, and the cross section of the third sacrificial pattern 125, the cross section of the first nanowire nw1, and the cross section of the second nanowire nw2 may be exposed.

Figure 19:
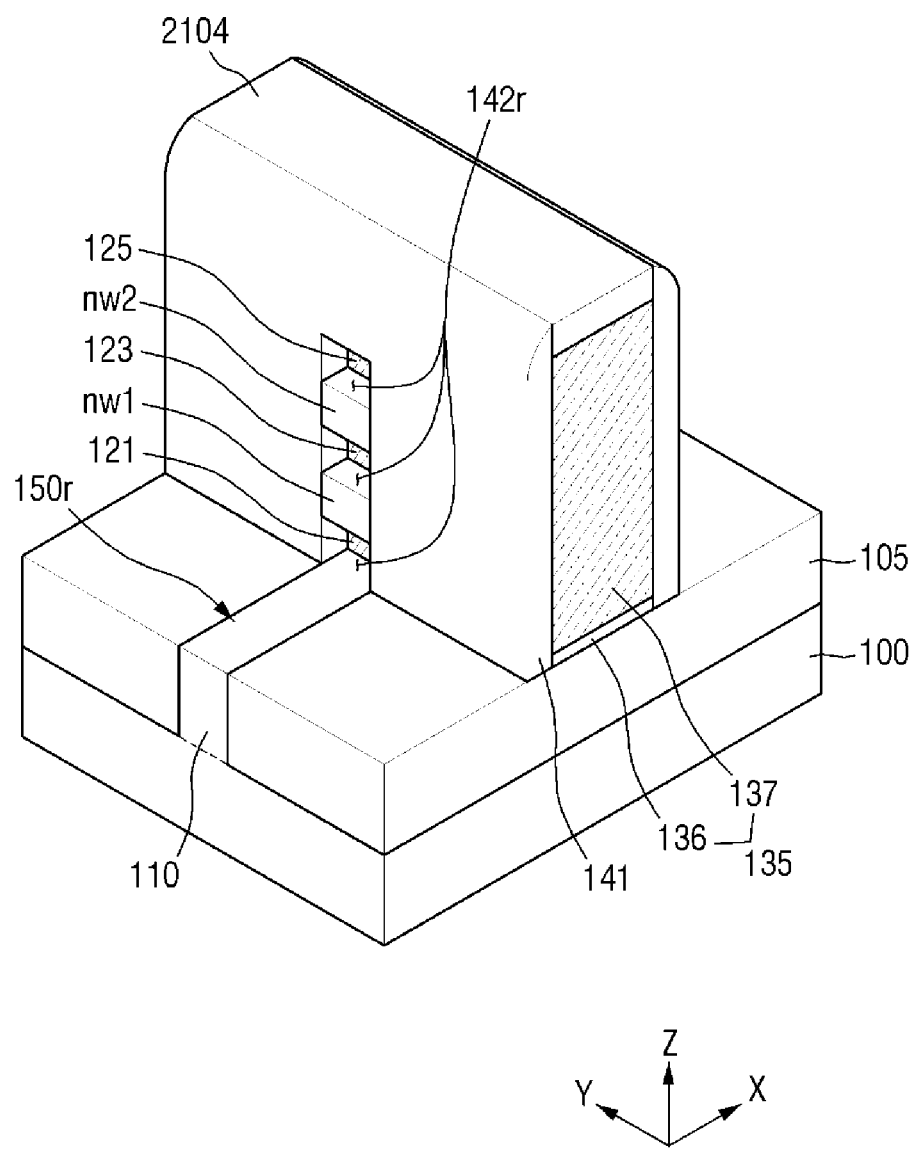

As shown in FIG. 19, at least a portion of the first sacrificial pattern 121, at least a portion of the second sacrificial pattern 123, and at least a portion of the third sacrificial pattern 125, being exposed by the recess 150r and overlapped with the outer spacer 141, may be removed. As a result, dimples 142r may be formed between the outer spacer 141, and the first nanowire nw1 and the second nanowire nw2.

The dimples 142r may be in a shape that is depressed in the first direction X further than the cross sections of the first nanowire nw1 and the second nanowire nw2 exposed by the recess 150r.

For example, the dimples 142r may be formed by using selective etching process. Specifically, the dimples 142r may be formed by the etching process using an etchant with a higher etch rate for the first to third sacrificial patterns 121 to 125, compared to the etch rate for the first and second nanowires nw1 and nw2.

Figure 20:
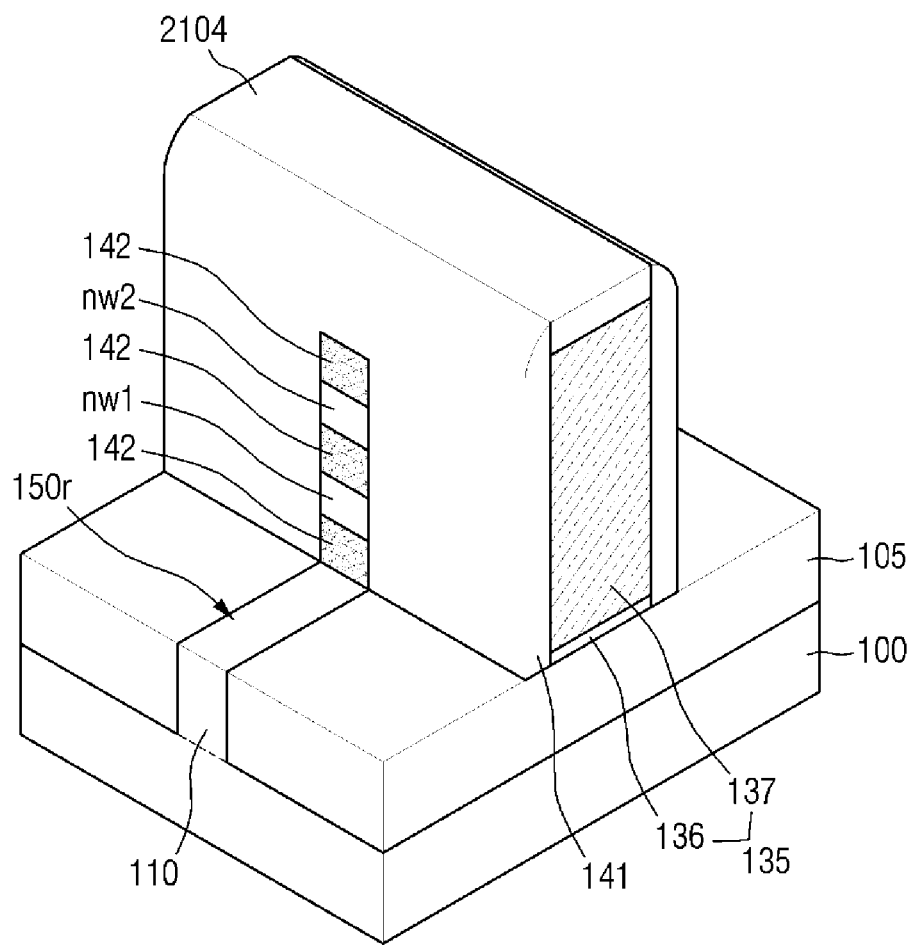

As shown in FIG. 20, the inner spacer 142 may be formed by filling the dimples 142r with an insulating material.

For example, a second spacer film filling the dimples 142r may be formed. The second spacer film may be a material with a good gap-filling ability. The second spacer film may also be formed on the field insulating film 105, the sidewall of the outer spacer 141, and also on the dummy gate pattern 135.

An etching process may then be performed, by etching the second spacer film until the upper surface of the fin-type pattern 110 non-overlapped with the dummy gate pattern 135 and the outer spacer 141 is exposed. As a result, the inner spacer 142 may be formed.

At this time, the thickness of the inner spacer 142 may be determined. The thickness of the inner spacer 142 may be equal to the thickness of the outer spacer 141. However, exemplary implementations are not limited to any of the examples given above. The thickness of the inner spacer 142 may be different from the thickness of the outer spacer 141.

Accordingly, the gate spacer 140 including the outer spacer 141 and the inner spacer 141 may be formed.

Further, the through holes 140h1, 140h2 defined by the outer spacer 141 and the inner spacer 142 may be formed in the gate spacer 140. The first nanowire nw1 and the second nanowire nw2 may be exposed through the through holes 140h1, 140h2. That is, the first nanowire nw1 and the second nanowire nw2 may be passed through the through holes 140h1, 140h2, respectively.

Figure 21:
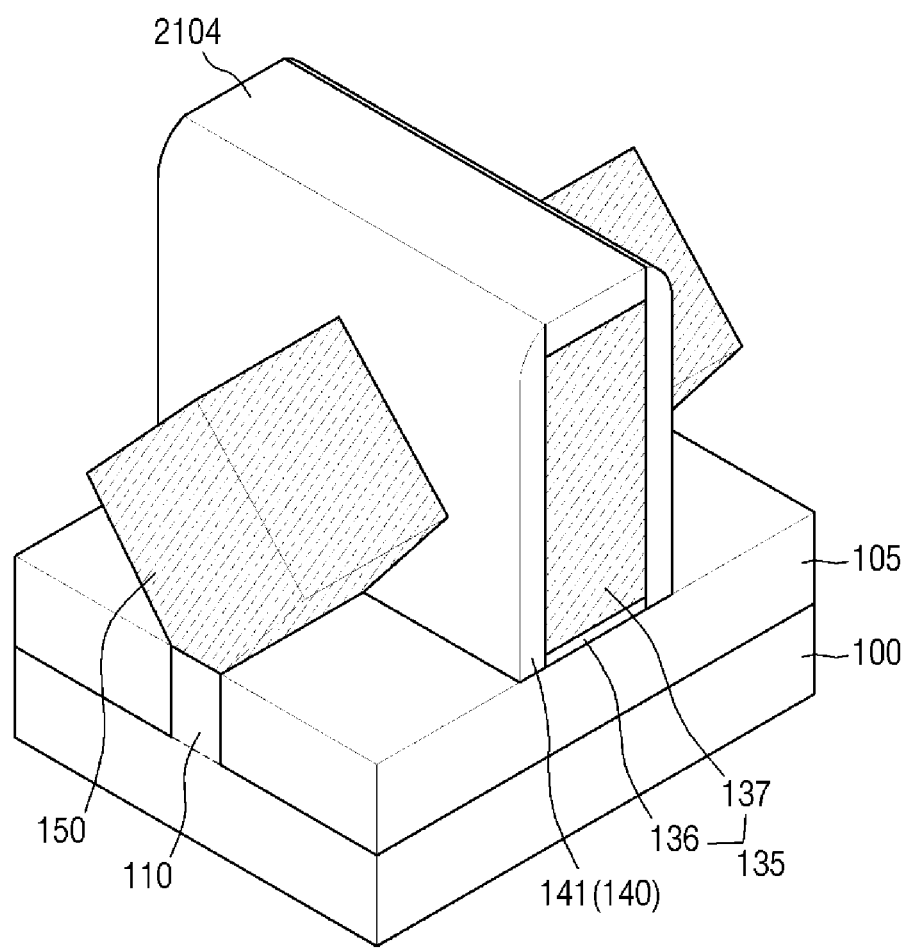

As shown in FIG. 21, a source/drain 150 filling the recess 150r may be formed. The source/drain 150 may be formed on both sides of the dummy gate pattern 135.

The source/drain 150 may be formed with the exposed fin-type pattern 110 and the first nanowire nw1 and the second nanowire nw2 as a seed layer, although exemplary implementations are not limited thereto. It is of course possible that the seed film is additionally formed on the protruding cross section of the first nanowire nw1 and the fin-type pattern 110 which are exposed by the recess 150r.

The source/drain 150 may be formed so as to cover the inner spacer 142. The source/drain 150 may contact the inner spacer 142.

The source/drain 150 may be formed by epitaxial process. Depending on whether the semiconductor device according to exemplary implementations is an n-type transistor or p-type transistor, the materials for the epitaxial layer included in the source/drain 150 may vary. Further, depending on needs, impurity may be doped in situ during epitaxial process.

Figure 22:
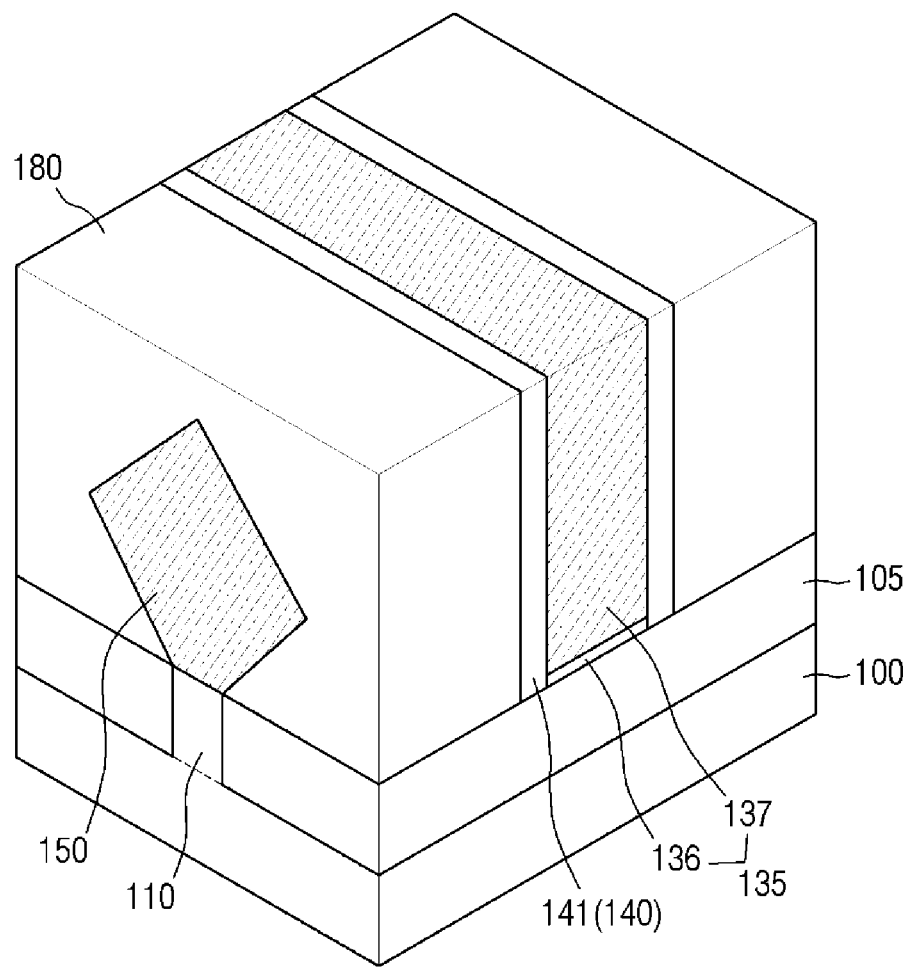

As shown in FIG. 22, the interlayer insulating film 180 covering the source/drain 150, the gate spacer 140, the dummy gate pattern 135, and so on may be formed on the field insulating film 105.

The interlayer insulating film 180 may include at least one of low-k material, oxide film, nitride film and oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD) oxide, or a combination thereof.

The interlayer insulating film 180 is then planarized until the upper surface of the dummy gate electrode 137 is exposed. As a result, the second mask pattern 2104 is removed, thus exposing the upper surface of the dummy gate electrode 137.

As shown in FIGS. 23 to 25, it is possible to remove the dummy gate pattern 135, i.e., the dummy gate insulating film 136 and the dummy gate electrode 137.

With the removal of the dummy gate insulating film 136 and the dummy gate electrode 137, the field insulating film 105 and the fin-type structure 110P overlapped with the dummy gate pattern 135 may be exposed. That is, the first sacrificial pattern 121, the second sacrificial pattern 123, the third sacrificial pattern 125, and the first nanowire pattern nw1 and the second nanowire pattern nw2 overlapped with the dummy gate pattern 135 may be exposed.

As shown in FIGS. 24 and 25, the first sacrificial pattern 121, the second sacrificial pattern 123, and the third sacrificial pattern 125 of the fin-type structure 110P may be removed.

As a result, spaces may be defined between the first nanowire nw1, the second nanowire nw2, and the fin-type pattern respectively. Further, the first nanowire nw1 and the second nanowire nw2 may be formed on the fin-type pattern 110.

Removing the first to third sacrificial patterns 121 to 125 over and under the first nanowire nw1 and the second nanowire nw2 may involve the use of an etching process, for example. That is, etch selectivities between the first to third sacrificial patterns 121 to 125, and the first and second nanowires nw1 and nw2 may be utilized.

Additionally, the removal of the first to third sacrificial patterns 121 to 125 may allow the inner spacer 142 of the gate spacer 140 to be exposed.

As shown in FIG. 10, an interfacial film 146 may be formed on peripheries of the first nanowire nw1 and the second nanowire nw2 and on the upper surface of the fin-type pattern 110.

The high-k insulating film 145 may then be formed along the sidewall of the gate spacer 140, i.e., along sidewalls of the outer spacer 141 and the inner spacer 142, and along the peripheries of the first nanowire nw1 and the second nanowire nw2. The high-k insulating film 145 may be in contact with the inner spacer 142. Accordingly, the gate insulating film 147 may be formed.

Next, the gate electrode 130 surrounding the first nanowire nw1 and the second nanowire nw2 and being extended in the second direction Y, may be formed. The gate electrode 130 may be a replacement metal gate electrode.

Hereinbelow, a layout design system according to some exemplary implementations, a semiconductor device using the layout design system, and a fabricating method thereof will be described with reference to FIG. 26. In the following description, description overlapped with the exemplary implementations already provided above will not be described or will be described as briefly as necessary for the sake of brevity.

Figure 26:
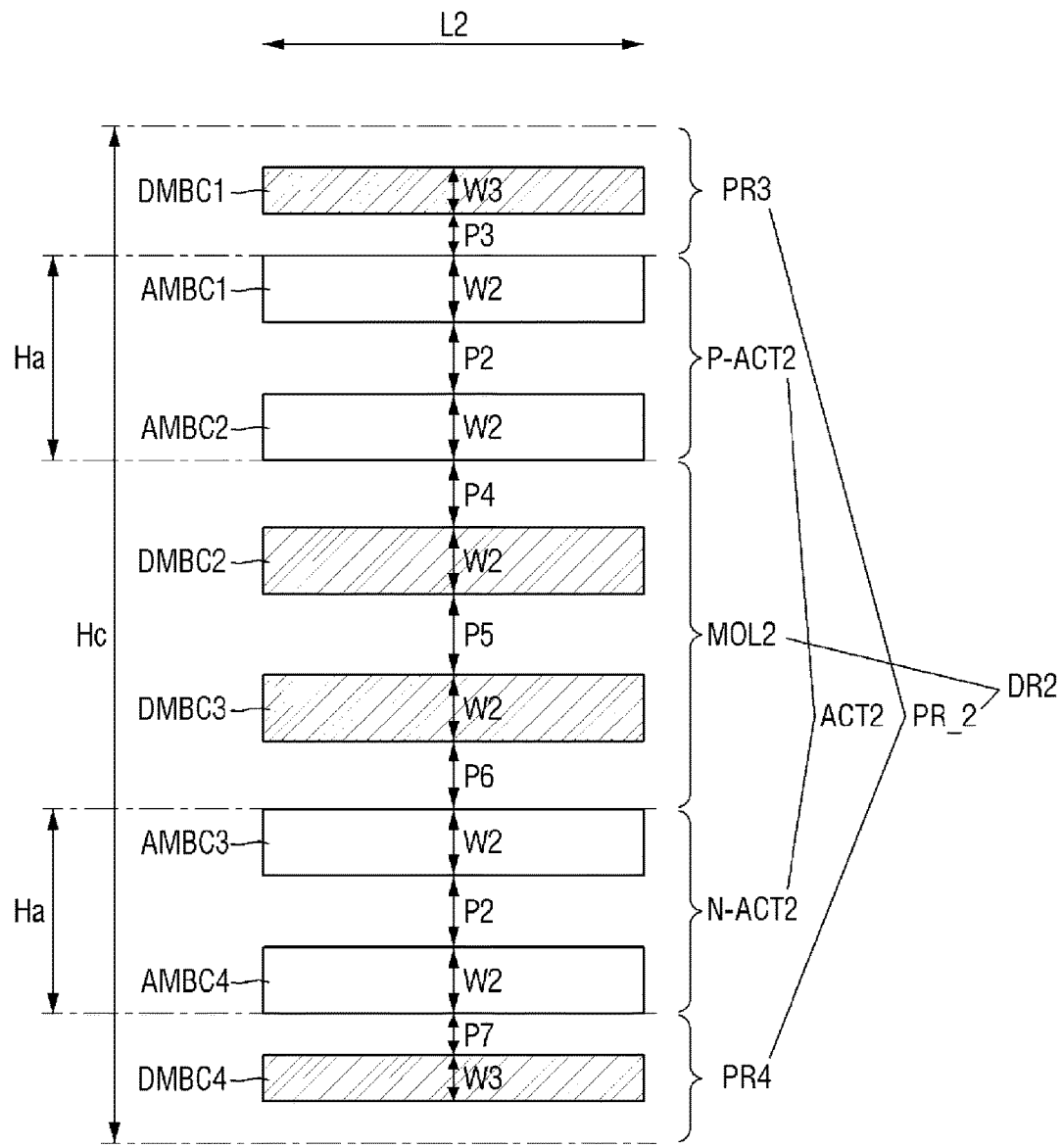
FIG. 26 is a layout diagram provided to explain a semiconductor device according to some exemplary implementations.

FIG. 26 is a layout diagram provided to explain a semiconductor device according to some exemplary implementations.

Referring to FIG. 26, the second layout L2 may include non-uniform alignment. The first dummy nanowire structure design DMBC1, the first and second active nanowire structure designs AMBC1, AMBC2, the second and third dummy nanowire structure designs DMBC2, DMBC3, the third and fourth active nanowire structure designs AMBC3, AMBC4, and the fourth dummy nanowire structure design DMBC4 may be sequentially disposed in parallel.

The first dummy nanowire structure design DMBC1 and the fourth dummy nanowire structure design DMBC4 may have the same third width W3, the first and second active nanowire structure designs AMBC1, AMBC2, the second and third dummy nanowire structure designs DMBC2, DMBC3, and the third and fourth active nanowire structure designs AMBC3, AMBC4 nanowire may all have the same second width W2. The second width W2 may be equal to or greater than two times the first width W1 of FIG. 5, or equal to or less than four times the first width W1 and the second width W2 may be greater than the width W3.

The pitch between first and second active nanowire structure designs AMBC1, AMBC2, and the pitch between the third and fourth active nanowire structure designs AMBC3, AMBC4 may correspond to the second pitch P2. In addition, AMBC2 is spaced apart from AMBC3 by the second MOL region MOL2.

That is, in the second active region ACT2, uniform alignment corresponding to the first layout L1 may be provided. However, the designs may be aligned non-uniformly in the second dummy region DR2. This is because the design for the second dummy region DR2 is not the active element that is actually used. Accordingly, the first dummy nanowire structure design DMBC1 and the first active nanowire structure design AMBC1 may be spaced apart by the third pitch P3, the second active nanowire structure design AMBC2 and the second dummy nanowire structure design DMBC2 may be spaced apart by the fourth pitch P4, the second dummy nanowire structure design DMBC2 and the third dummy nanowire structure design DMBC3 may be spaced apart by the fifth pitch P5, the third dummy nanowire structure design DMBC3 and the third active nanowire structure design AMBC3 may be spaced by the sixth pitch P6, and the fourth active nanowire structure design AMBC4 and the fourth dummy nanowire structure design DMBC4 may be spaced apart by the seventh pitch P7. The second to seventh pitches P2-P7 may all be different.

Hereinbelow will be described a layout design system according to some exemplary implementations. More particularly, there will be described a semiconductor device using the layout design system, and a fabricating method thereof with reference to FIG. 27. In the following description, description overlapped with the exemplary embodiments already provided above will not be described or described as brief as possible for the sake of brevity.

Figure 27:
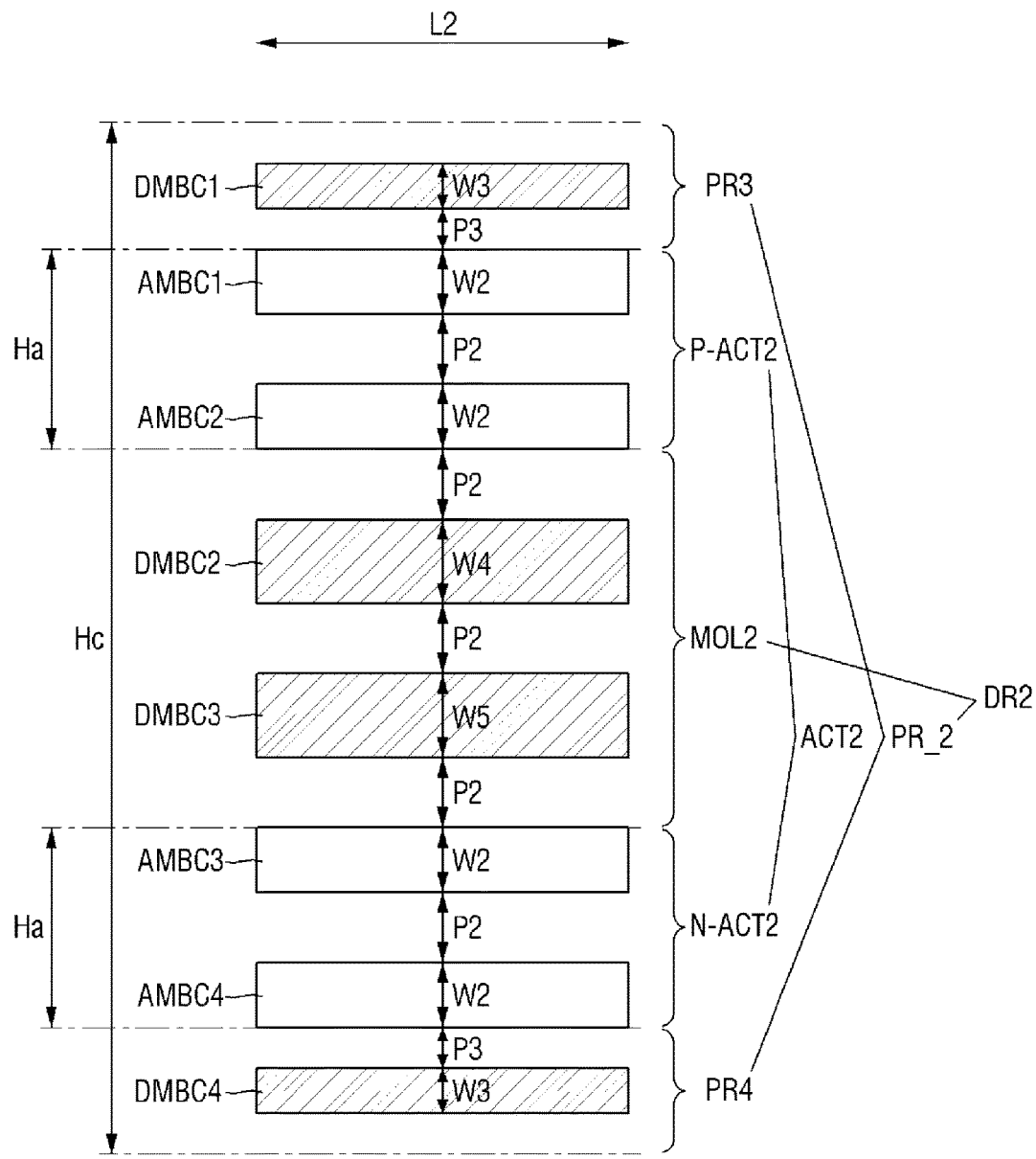
FIG. 27 is a layout diagram provided to explain a semiconductor device according to some exemplary implementations.

FIG. 27 is a layout diagram provided to explain a semiconductor device according to some exemplary implementations.

As shown in FIG. 27, each of the designs of the second layout L2 may have non-uniform widths. The first dummy nanowire structure design DMBC1, the first and second active nanowire structure designs AMBC1, AMBC2, the second and third dummy nanowire structure designs DMBC2, DMBC3, the third and fourth active nanowire structure designs AMBC3, AMBC4, and the fourth dummy nanowire structure design DMBC4 may be sequentially disposed in parallel.

The first and second active nanowire structure designs AMBC1, AMBC2, the third and fourth active nanowire structure designs AMBC3, AMBC4, and the fourth dummy nanowire structure design DMBC4 may all have the same second width W2. The second width W2 may be equal to or greater than two times the first width W1 of FIG. 5, or equal to or less than four times the first width W1.

The pitch between first and second active nanowire structure designs AMBC1, AMBC2, and the pitch between the third and fourth active nanowire structure designs AMBC3, AMBC4 may correspond to the second pitch P2.

That is, in the second active region ACT2, the designs may have uniform width corresponding to the first layout L1. However, the designs may have non-uniform widths in the second dummy region DR2. This is because the designs for the second dummy region DR2 are not the active elements that are actually used. Accordingly, the width of the second dummy nanowire structure design DMBC2 may be the fourth width W4, and the width of the third dummy nanowire structure design DMBC3 may be the fifth width W5. The second to fifth widths W2-W5 may be different widths from one another.

Hereinbelow there will be described a layout design system according to some exemplary implementations. More particularly, there will be described a semiconductor device using the layout design system, and a fabricating method thereof with reference to FIG. 28. In the following description, description overlapped with the exemplary embodiments already provided above will not be described or described as brief as possible for the sake of brevity.

Figure 28:
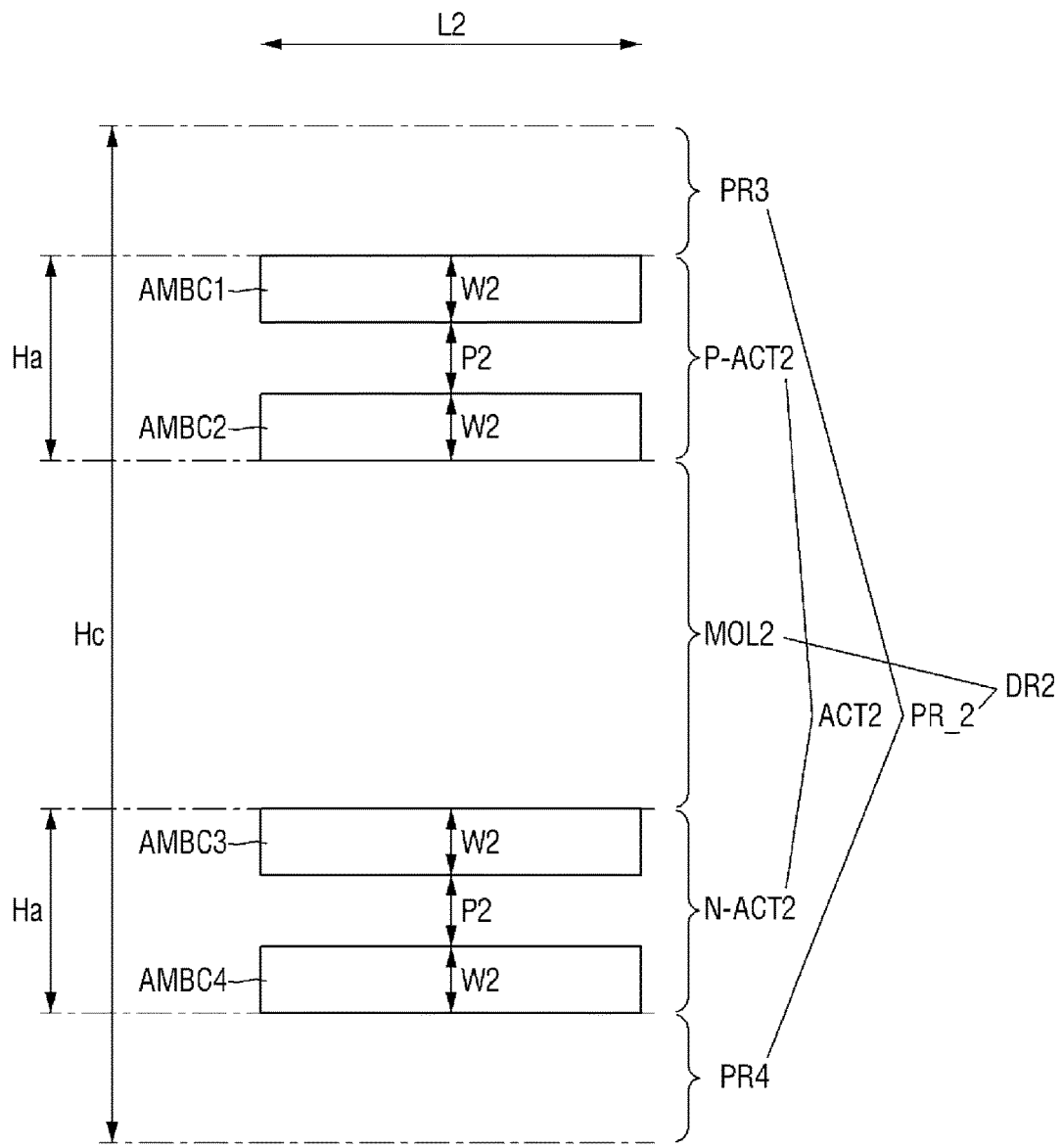
FIG. 28 is a layout diagram provided to explain a semiconductor device according to some exemplary implementations.

FIG. 28 is a layout diagram provided to explain a semiconductor device according to some exemplary implementations.

As shown in FIG. 28, the second layout L2 may include designs for the second active region ACT2, but may not include the designs for the second dummy region DR2. That is, because the designs for the second dummy region DR2 may be structures that are not actually-used active elements, but are fabricated based on the fabrication of the active elements so that they may not be necessarily formed. Further, because the width of the nanowire structure may be slightly increased compared with the fin-type pattern, use of DPT or QPT may not be necessary, and even when DPT or QPT is used, dummy designs still may not be formed by adjusting the mandrel width. As a result, cost for the fabrication of the dummy structure may be minimized, while undesired effects attributable to the undesired structures may be limited.

Hereinbelow, a semiconductor device according to some exemplary implementations will be described with reference to FIGS. 3, 29 and 30. In the following, description that overlaps with exemplary implementations already described above will not be further described or will be described as briefly as necessary for the sake of brevity.

Figure 29:
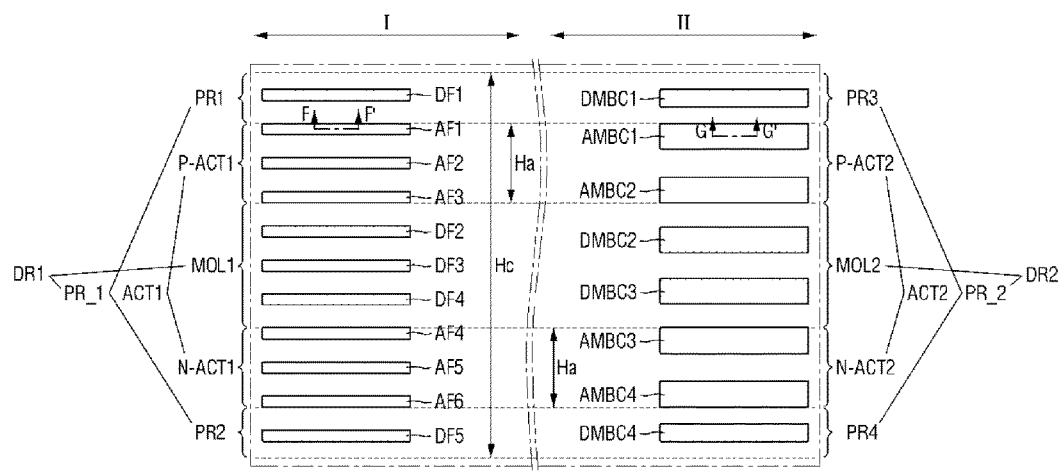
FIG. 29 is a layout diagram provided to explain a semiconductor device according to some exemplary implementations.
Figure 30:
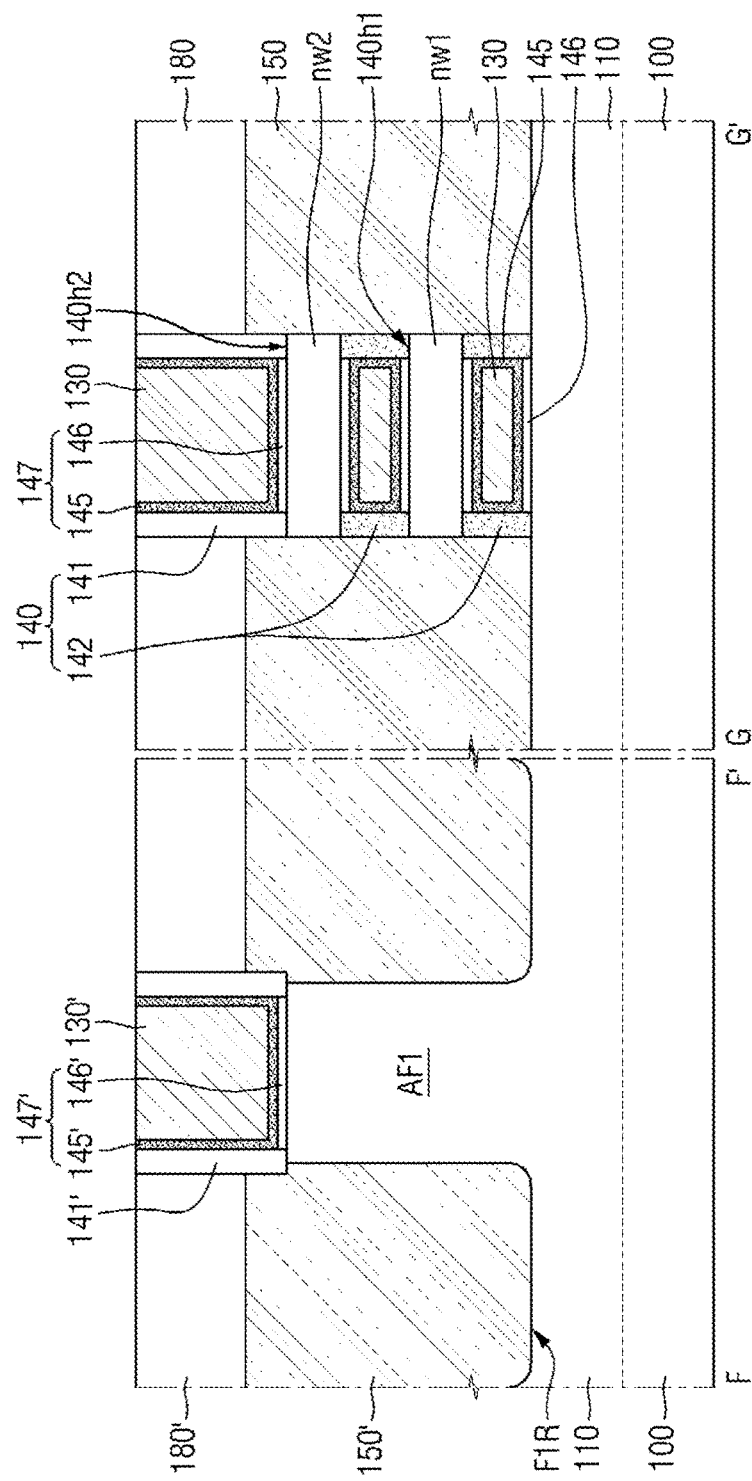
FIG. 30 is a cross sectional view taken on lines F-F' and G-G' of FIG. 29.

FIG. 29 is a layout diagram provided to explain a semiconductor device according to some exemplary implementations, and FIG. 30 is a cross sectional view taken on lines F-F' and G-G' of FIG. 29.

As shown in FIGS. 3, 29 and 30, a semiconductor device according to some exemplary implementations may include a first region I and a second region II. In the first region I, a semiconductor device using a fin-type pattern according to the first layout L1 of FIG. 3 may be formed, and in the second region II, a semiconductor device using a nanowire structure according to the second layout L2 of FIG. 3 may be formed.

That is, both the fin-type pattern and the nanowire may be simultaneously formed in one device. For example, the second region II of the nanowire may be the region where high integration density and high performance are necessary as this is where the fringing capacitance can be reduced, while the first region I of the fin-type pattern may be the region for the nanowire process of relatively high sensitivity.

The first active fin AF1 may be protruded on the substrate 100, and the fin-type pattern gate electrode 130' may be extended in a direction of intersecting with the first active fin AF1. The fin-type pattern gate insulating film 147' may include a fin-type pattern interfacial film 146' and a fin-type pattern high-k dielectric insulating film 145'. The fin-type pattern gate spacers 141' may be formed on both sidewalls of the fin-type pattern gate electrode 130'. The fin-type pattern source/drains 151' may be formed on both sides of the fin-type pattern gate electrode 130' by recessing F1R in the first active fin AF1.

The first PMOS region P-ACT1 where the first to third active fins AF1-AF3 are formed, and the second PMOS region P-ACT2 where the first and second active nanowire structures AMBC1, AMBC2 are formed, may have the same width. The width may correspond to the active height Ha.

The first NMOS region N-ACT1 where the fourth to sixth active fins AF4-AF6 are formed, and the second NMOS region N-ACT2 where the third and fourth active nanowire structures AMBC3, AMBC4 are formed, may have the same width. The width may correspond to the active height Ha.

Figure 31:
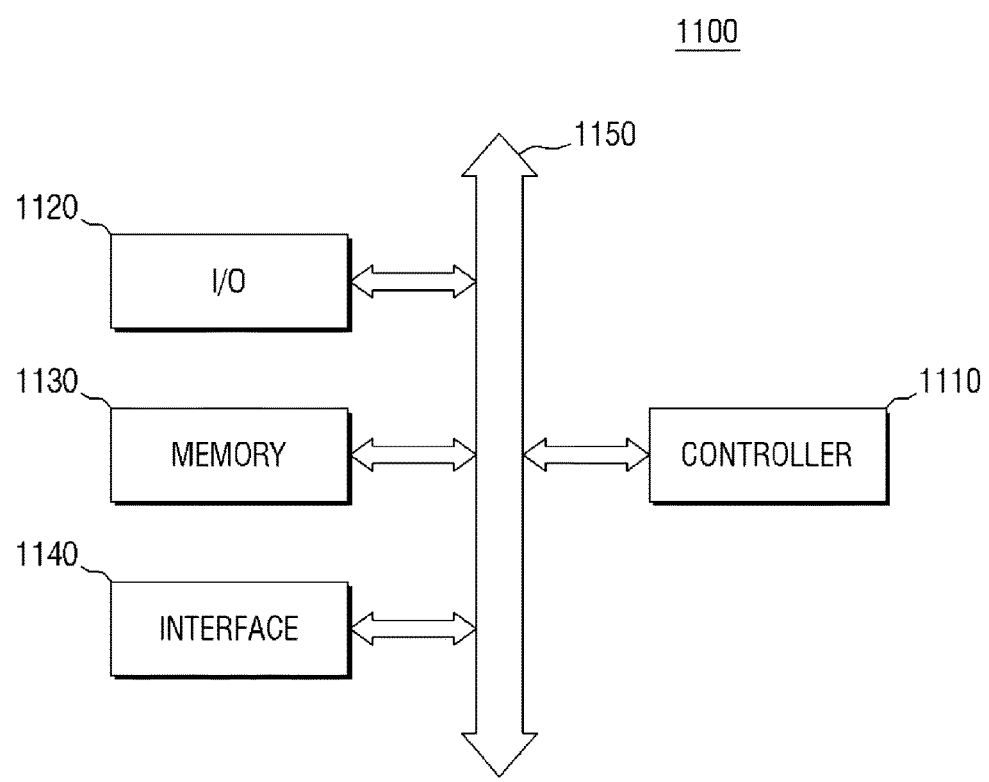
FIG. 31 is a block diagram of an electronic system including a semiconductor device according to some exemplary implementations.

FIG. 31 is a block diagram of an electronic system including a semiconductor device according to some exemplary implementations.

As shown in FIG. 31, the electronic system 1100 according to an exemplary implementation may include a controller 1110, an input/output (I/O) device 1120, a memory device 1130, an interface 1140 and a bus 1150. The controller 1110, the I/O device 1120, the memory device 1130 and/or the interface 1140 may be connected with one another via the bus 1150. The bus 1150 corresponds to a path through which data travels.

The controller 1110 may include at least one of microprocessor, digital signal process, micro controller, or logic devices capable of performing functions similar to the functions of those mentioned above. The I/O device 1120 may include a keypad, a keyboard, a display device, and so on. The memory device 1130 may store data and/or instructions, and so on. The interface 1140 may perform a function of transmitting or receiving data to or from communication networks. The interface 1140 may be in a wired or wireless form. For example, the interface 1140 may include an antenna or a wired/wireless transceiver. Although not illustrated, the electronic system 1100 may additionally include an operation memory configured to enhance operation of the controller 1110, such as a high-speed dynamic random access memory (DRAM) and/or a static random access memory (SRAM). According to some exemplary embodiments, the semiconductor device may be provided within the memory device 1130, or provided as a part of the controller 1110, or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in a wireless or wired environment.

Figure 32:
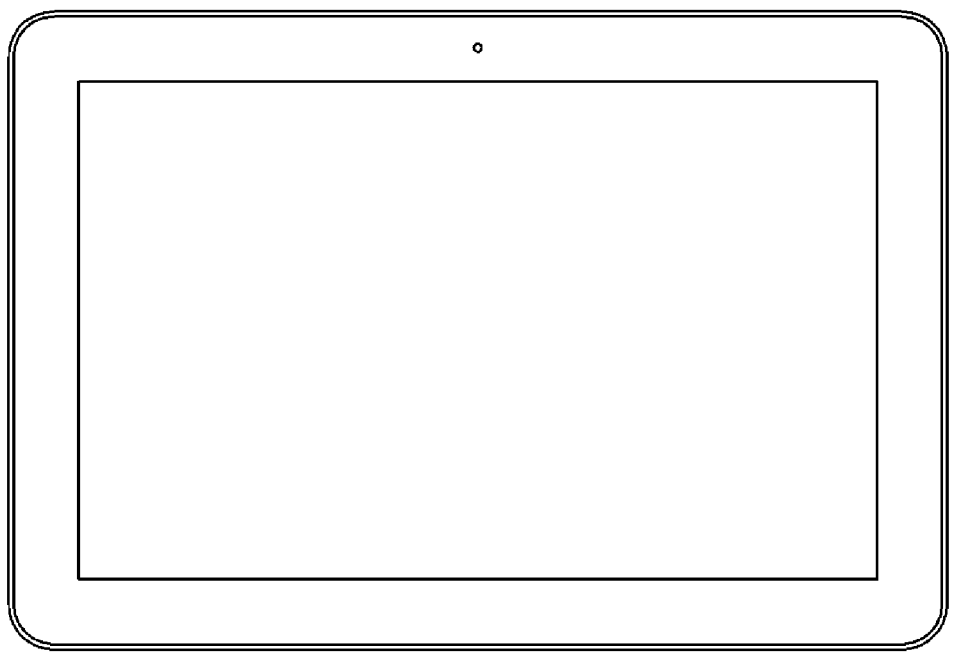
FIGS. 32 and 33 illustrate an exemplary semiconductor system which may apply a semiconductor device according to some exemplary implementations therein.
Figure 33:
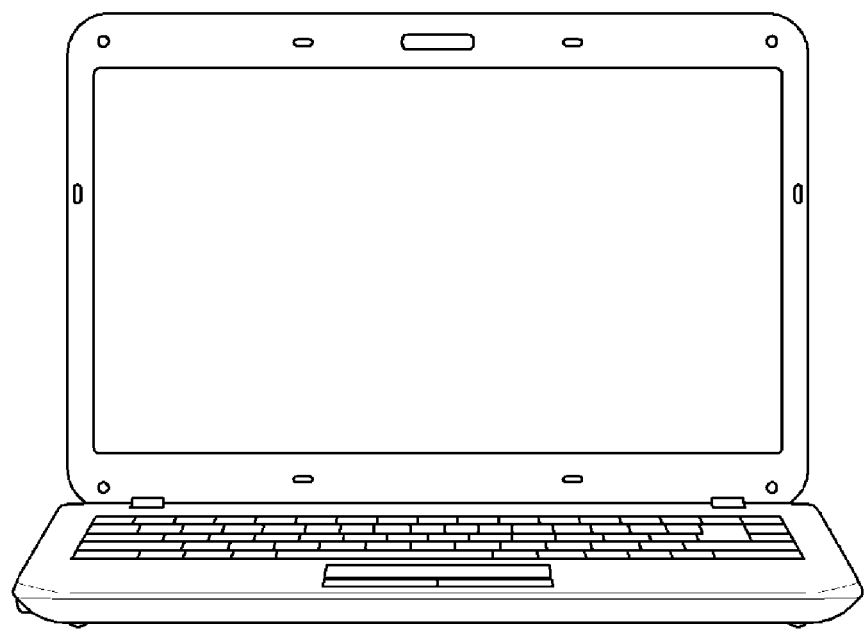

FIGS. 32 and 33 illustrate an exemplary semiconductor system which may apply a semiconductor device according to some exemplary implementations. FIG. 32 illustrates a tablet PC 1200 and FIG. 33 illustrates a laptop computer 1300. At least one of the semiconductor devices according to some exemplary implementations may be used in the tablet PC 1200, the laptop computer 1300, and so on. It will be apparent to those skilled in the art that the semiconductor device according to some exemplary implementations is applicable to other integrated circuit devices not illustrated herein.

While the present inventive concept has been particularly shown and described with reference to exemplary implementations thereof, it will be understood by those of ordinary skill in the art that various changes in form and details may be made therein without departing from the spirit and scope of the present inventive concept as defined by the following claims. It is therefore desired that the present exemplary implementations be considered in all respects as illustrative and not restrictive, reference being made to the appended claims rather than the foregoing description to indicate the scope of the invention.

What is claimed is:

1. A fabricating method of a semiconductor device, comprising:
providing a first layout, wherein the first layout comprises a first active region and a first dummy region, and the first active region comprises a fin-type pattern design having a plurality of fin structures each fin structure having a first width;
generating a second layout by substituting the fin-type pattern design with a nanowire structure design; and
forming the nanowire structure design by using the second layout,
wherein the second layout comprises a second active region having the same size as the first active region, and a second dummy region having the same size as the first dummy region,
wherein nanowire structures of the nanowire structure design each have a second width greater than the first width, and the nanowire structure design comprises:
a first nanowire structure extending in a first direction,
a second nanowire structure extending in the first direction and being formed on the first nanowire structure and spaced apart from the first nanowire structure, a gate electrode surrounding a periphery of the first nanowire structure and extending in a second direction intersecting with the first direction, a gate spacer being formed on a sidewall of the gate electrode and comprising an inner sidewall and an outer sidewall facing each other, the inner sidewall of the gate spacer facing a side surface of the gate electrode, and a source/drain epitaxial layer on at least one side of the gate electrode and being connected to the first nanowire structure.

2. The fabricating method of claim 1, wherein the first layout and the second layout have the same size.

3. The fabricating method of claim 2, wherein a location of the first active region in the first layout and a location of the second active region in the second layout are similarly located within their respective layouts.

4. The fabricating method of claim 1, wherein the fin-type pattern design comprises first to third fin-type pattern designs extending in parallel, and the nanowire structure design comprises first and second nanowire structures extending in parallel.

5. The fabricating method of claim 1, wherein the second width of each of the nanowire structures is greater than or equal to two times the first width of each fin structure.

6. The fabricating method of claim 1, wherein the second width of each of the nanowire structures is less than or equal to four times the first width of each fin structure.

7. The fabricating method of claim 1, wherein the first dummy region comprises a dummy fin-type pattern design, and the second dummy region comprises a dummy nanowire structure design.

8. The fabricating method of claim 7, wherein each dummy fin of the dummy fin-type pattern design has the first width.

9. The fabricating method of claim 7, wherein the nanowire structure design comprises first and second nanowire structure designs extending in parallel and being spaced apart from each other by a second pitch, and
wherein the dummy nanowire structure design of the second dummy region comprises first and second dummy nanowire structures spaced apart by the second pitch.

10. A fabricating method of a semiconductor device, comprising:
providing a first layout, wherein the first layout comprises first to third fin-type pattern designs extending in parallel;
removing the first to third fin-type pattern designs from the first layout;
generating a second layout by adding to the first layout first and second nanowire structure designs extending in parallel in a first direction; and
forming first and second nanowire structures on a substrate by using the second layout,
wherein the first nanowire structure comprises at least two nanowires extending in the same direction.

11. The fabricating method of claim 10, wherein the nanowires comprise a first nanowire, and a second nanowire formed on the first nanowire spaced apart from the first nanowire.

12. The fabricating method of claim 10, wherein the nanowires extend in a first direction, and
wherein the first nanowire structure comprises a gate electrode surrounding the nanowires and extending in a second direction that intersects with the first direction.

13. The fabricating method of claim 12, further comprising a gate spacer formed on a sidewall of the gate electrode and comprising an inner sidewall and an outer sidewall facing each other, wherein the inner sidewall of the gate spacer faces the gate electrode.

14. The fabricating method of claim 12, wherein the nanowires further comprise a third nanowire formed on first and second nanowires and being formed spaced apart from the first and second nanowires.

15. The fabricating method of claim 10, wherein the first layout comprises a dummy fin-type pattern design extending parallel with the first to third fin-type pattern designs, and
forming the second layout comprises removing the dummy fin-type pattern design and adding a dummy nanowire structure design.

16. The fabricating method of claim 15, wherein the dummy fin-type pattern design comprises a power rail fin-type pattern design for power supply,
wherein the dummy nanowire structure design comprises a power rail nanowire structure design, and
wherein forming the second layout comprises substituting the power rail fin-type pattern design with the power rail nanowire structure design.

17. The fabricating method of claim 16, wherein a width of the power rail nanowire structure design is greater than a width of the power rail fin-type pattern design.

18. The fabricating method of claim 16, wherein the dummy fin-type pattern design comprises a MOL dummy fin-type pattern design spaced apart from the power rail fin-type pattern design, and
wherein forming the second layout comprises removing the MOL dummy fin-type pattern design.

19. The fabricating method of claim 15, wherein the dummy fin-type pattern design is arranged at a uniform pitch, and
wherein the dummy nanowire structure design is arranged at a non-uniform pitch.

20. A fabricating method of a semiconductor device, comprising:
providing a first layout and detecting a first active region in the first layout, wherein a fin-type pattern design of a first width having fins spaced apart by a first pitch in the first active region;
removing the fin-type pattern design in the first active region;
generating a second layout comprising a second active region by substituting the first active region with the second active region wherein a nanowire structure design has nanowire structures spaced apart by a second pitch different from the first pitch;
forming the nanowire structures by using the second layout; and
forming a contact on the nanowire structures by using an upper structure layout, wherein the upper structure layout corresponds to the first layout.

* * * * *